(12) United States Patent
Yamashita et al.

(10) Patent No.: US 7,765,077 B2
(45) Date of Patent: Jul. 27, 2010

(54) METHOD AND APPARATUS FOR CREATING A SPACER-OPTIMIZATION (S-O) LIBRARY

(75) Inventors: Asao Yamashita, Fishkill, NY (US); Merritt Funk, Austin, TX (US); Daniel J. Prager, Hopewell Junction, NY (US); Lee Chen, Cedar Creek, TX (US); Radha Sundaranajan, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 481 days.

(21) Appl. No.: 11/859,596

(22) Filed: Sep. 21, 2007

(65) Prior Publication Data

US 2009/0082983 A1    Mar. 26, 2009

(51) Int. Cl.
*G01D 18/00*    (2006.01)
(52) U.S. Cl. ........................................ 702/85
(58) Field of Classification Search ............... 702/85; 438/592, 14, 9, 2; 700/121; 356/625; 257/48
See application file for complete search history.

(56) References Cited

U.S. PATENT DOCUMENTS

| | | | |
|---|---|---|---|
| 6,789,033 B2 * | 9/2004 | Solecky et al. | 702/85 |
| 2005/0185197 A1 * | 8/2005 | Tao et al. | 356/625 |
| 2006/0154388 A1 * | 7/2006 | Lewington et al. | 438/17 |
| 2006/0186406 A1 * | 8/2006 | Bushman et al. | 257/48 |
| 2007/0202675 A1 * | 8/2007 | Srivastava | 438/592 |
| 2008/0241969 A1 * | 10/2008 | Winkler et al. | 438/5 |
| 2008/0243295 A1 * | 10/2008 | Winkler et al. | 700/121 |
| 2008/0243297 A1 * | 10/2008 | Winkler et al. | 700/121 |
| 2008/0311687 A1 * | 12/2008 | Yamashita et al. | 438/9 |
| 2008/0311688 A1 * | 12/2008 | Yamashita et al. | 438/14 |

* cited by examiner

*Primary Examiner*—Tung S Lau
*Assistant Examiner*—Xiuquin Sun

(57) ABSTRACT

The invention can provide a method of processing a substrate using Spacer-Optimization (S-O) processing sequences and evaluation libraries that can include one or more optimized spacer creation and evaluation procedures. In addition, the S-O processing sequences can include one or more deposition procedures, one or more partial-etch procedures, one or more chemical oxide removal (COR)-etch procedures, one or more optimization procedures, one or more evaluation procedures, and/or one or more verification procedures.

16 Claims, 18 Drawing Sheets

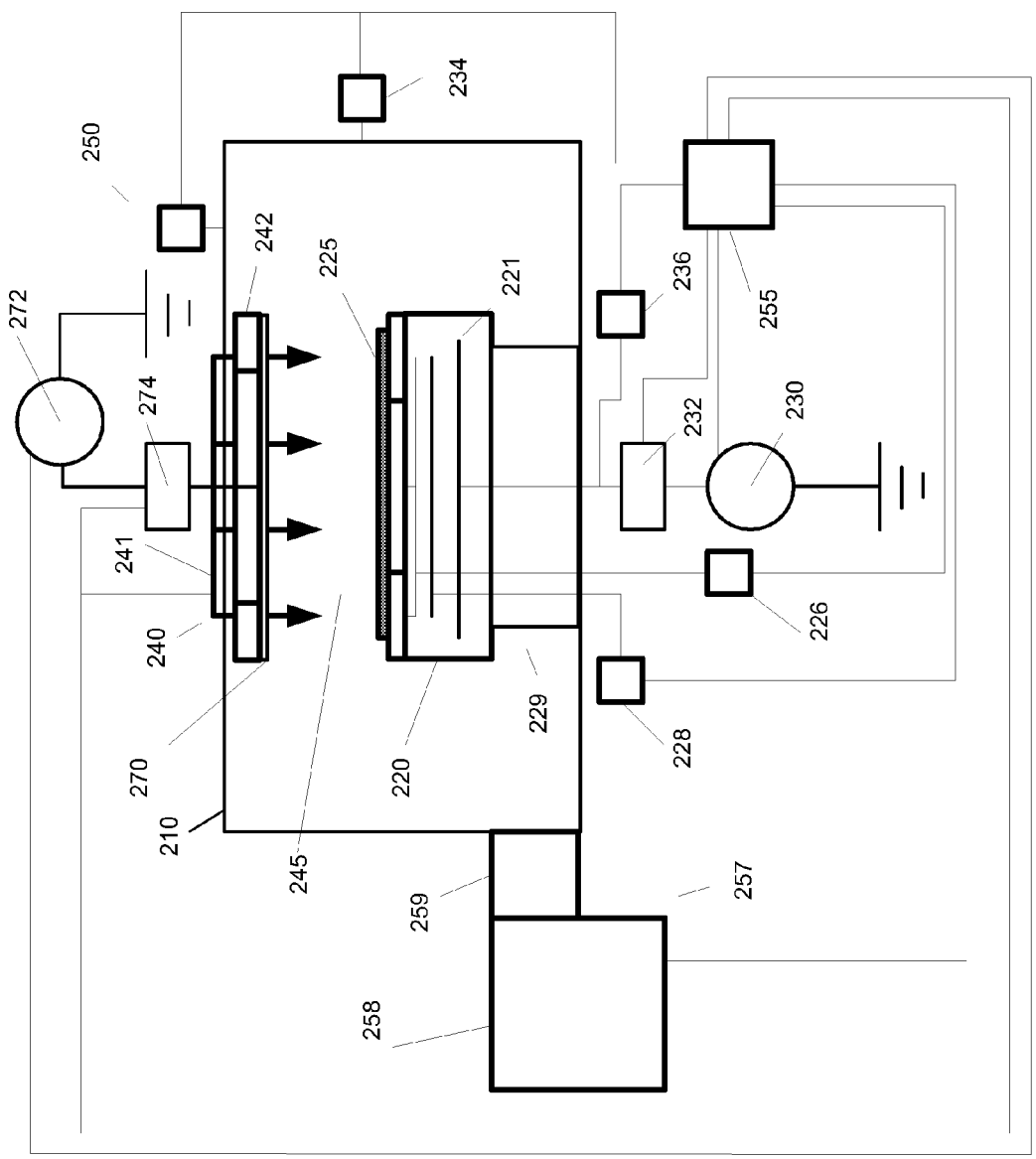

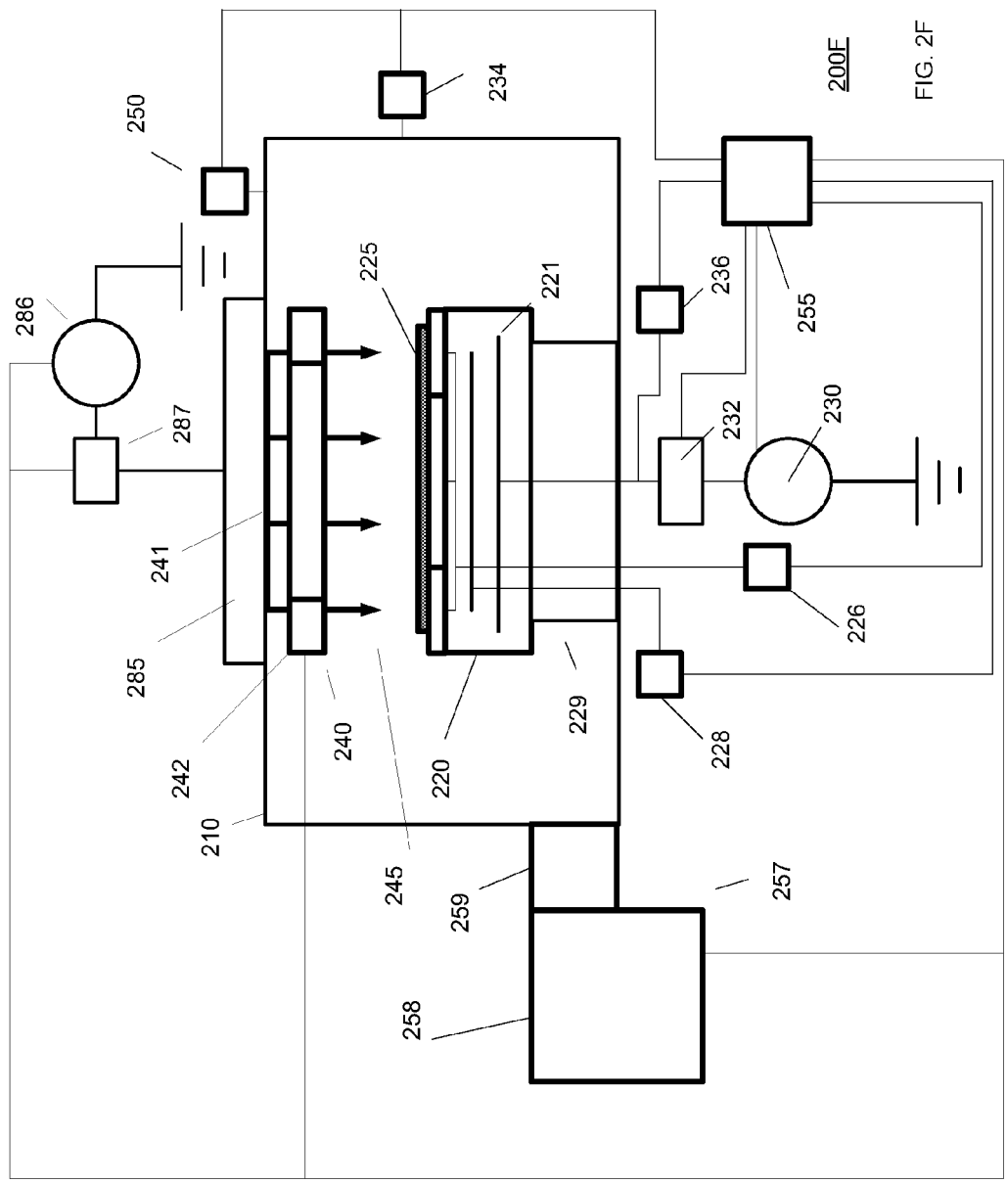

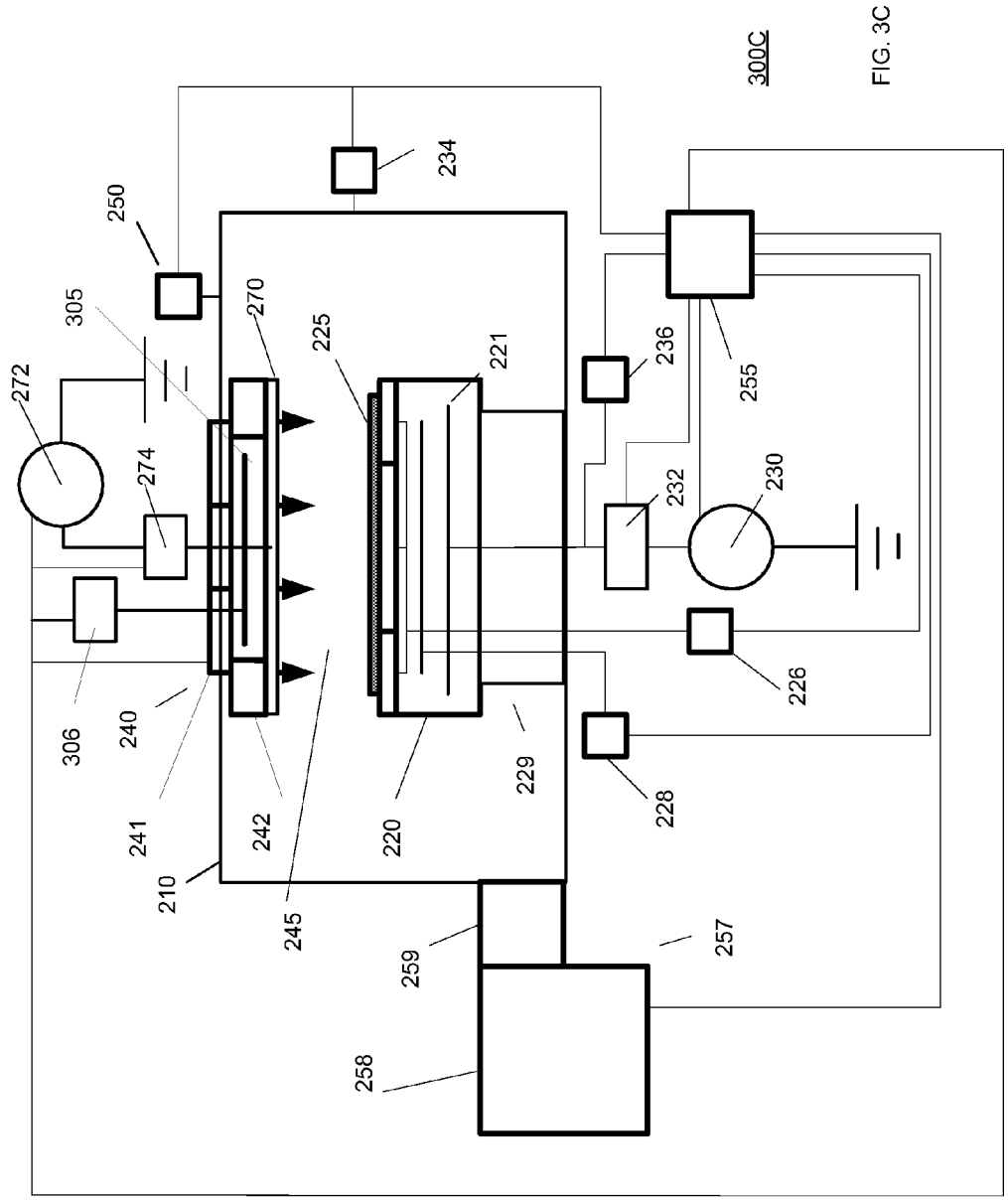

METHOD AND APPARATUS FOR CREATING A SPACER-OPTIMIZATION (S-O) LIBRARY

CROSS-REFERENCE TO RELATED APPLICATIONS

This application is related to co-pending Ser. No. 11/859,507, entitled "Method and Apparatus for Spacer-Optimization (S-O)", filed herewith and the contents of this application are herein incorporated by reference in its entirety.

BACKGROUND OF THE INVENTION

1. Field of the Invention

The present invention relates to substrate processing, and more particularly to improving the substrate processing using optimized spacer procedures and subsystems.

2. Description of the Related Art

Current low cost products use a bulk silicon technology. As the transistor continues to shrink, the impact of the channel depth is becoming critical (ultra-shallow source/drain extensions). As the SOI (silicon-on-insulator) film shrinks, smaller variations in the spacer thickness and thickness of the SOI film can affect the transistor's performance. When spacer-etch procedures are not controlled, the removal of the spacer material near the gate affects the electrical performance.

Current high performance microprocessors from device manufacturers, such as International Business Machines (IBM) and Advanced Micro Devices (AMD), use PD SOI (partially depleted SOI film having a threshold voltage 0.2 volts. PD SOI film thicknesses are around 50 nm while the spacer reduction amount can be a large percentage (e.g., 10%) of the total spacer thickness. Future generations of SOI films are labeled FD SOI (fully depleted SOI film having a threshold voltage 0.08 volts and a thickness of about 25 nm). Currently theses films are not in production due to limitations in thickness control uniformity and defects. Channel mobility degrades with decreasing SOI thickness. With thinner SOI film, the control of the spacer sidewall thickness becomes more critical.

SUMMARY OF THE INVENTION

The invention can provide apparatus and methods of processing a substrate in real-time using Spacer-Optimization (S-O) procedures and evaluation libraries to control spacer thickness, to control spacer uniformity, and to eliminate damage to the transistor structures.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2F shows exemplary block diagrams of etching subsystems in accordance with embodiments of the invention;

FIGS. 3A-3F shows exemplary block diagrams of additional etching subsystems in accordance with embodiments of the invention;

DETAILED DESCRIPTION

The invention provides apparatus and methods for processing substrates having a large number of semiconductor devices thereon and an even larger number of transistor gate and/or spacer structures. In various embodiments, apparatus and methods are provided for creating and/or using an S-O evaluation library, for performing S-O processing sequences that can include one or more deposition procedures, one or more partial-etch procedures, one or more chemical oxide removal (COR)-etch procedures, and/or for verifying S-O procedures.

One or more evaluation features can be provided at various locations on a substrate and can be used to evaluate and/or verify S-O procedures. Substrates can have substrate data associated with them, and the substrate data can include real-time and historical data. In addition, the substrate can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with S-O substrate can include transfer sequence data that can be used to establish when and where to transfer S-O substrates. Processing sequences can also be established for each S-O substrate.

In some examples, the received substrates can have spacer material deposited on them by a previous process or an external system, and the S-O processing sequences can include one or more spacer-etch procedures, one or more COR-etch procedures, one or more evaluation procedures, and one or more transfer sequences. For example, transfer sequences can be established based on the number of substrates that require spacer-etch processing, the number of substrates that require COR-etch processing, the number of available processing elements, the number of substrates that require evaluation, the number of available evaluation elements, the loading data for one or more transfer subsystems.

As feature sizes decrease below the 65 nm node, accurate processing and/or measurement data becomes more important and more difficult to obtain. S-O procedures can be used to more accurately process and/or measure these ultra-small devices and features. The data from an S-O procedure can be compared with the warning and/or control limits, when a run-rule is violated, an alarm can be generated indicating a processing problem, and correction procedures can be performed in real time.

Figure 1:
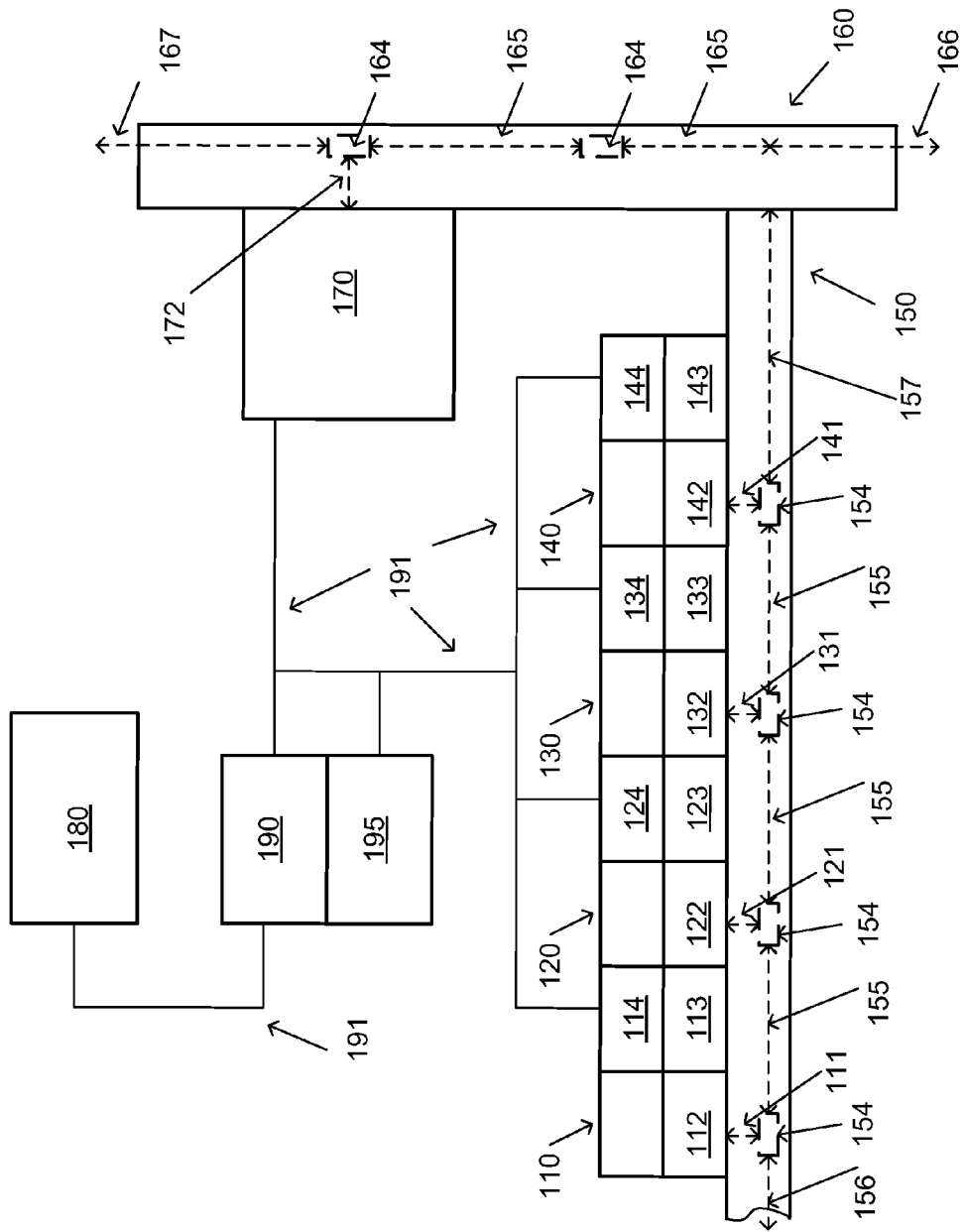
FIG. 1 shows an exemplary block diagram of a processing system in accordance with embodiments of the invention.

Therefore, according to an embodiment, a method of processing a substrate is described. The method comprises performing a first S-O sequence using a first etching subsystem, a first Chemical Oxide Removal (COR) subsystem, a first transfer subsystem, and a first evaluation subsystem wherein a first oxygen-containing spacer layer is produced on a plurality of gate structures and on one or more evaluation features on a first set of substrates; and obtaining first evaluation data for a first evaluation substrate using the first evaluation subsystem, the first evaluation data including Integrated Metrology (IM) data for a first evaluation feature associated with a first gate structure, the first evaluation feature having the first oxygen-containing spacer layer thereon. Additionally, the method comprises identifying the first set of substrates as first verified substrates when the first evaluation data is less than or equal to first threshold data; and identifying the first set of substrates as first un-verified substrates and performing a first corrective action, when the first evaluation data is greater than the first threshold data FIG. 1 shows an exemplary block diagram of a processing system in accordance with embodiments of the invention. In the illustrated embodiment, processing system 100 comprises an etching subsystem 110, a Chemical Oxide Removal (COR) subsystem 120, a deposition subsystem 130, an evaluation subsystem 140, a first transfer subsystem 150, a second transfer subsystem 160, a lithography subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more processes.

The processing system 100 can be used to perform and/or verify one or more S-O procedures. In some embodiments, one or more substrates can be received by one or more transfer subsystems (150, 160), and the transfer subsystems (150, 160) can transfer one or more of the substrates to one or more of the subsystems (110, 120, 130, 140, and 150) in the processing system 100. In other embodiments, one or more substrates can be received by one or more of the subsystems (110, 120, 130, 140, and 150) in the processing system 100.

The system controller 190 can be coupled to the etching subsystem 110, the COR subsystem 120, the deposition subsystem 130, the evaluation subsystem 140, the first transfer subsystem 150, the second transfer subsystem 160, and the lithography subsystem 170 using a data transfer subsystem 191. The system controller 190 can be coupled to the MES 180 using the data transfer subsystem 191. Alternatively, other configurations may be used.

The etching subsystem 110 can be coupled to the first transfer subsystem 150 and one or more substrates (not shown) can be transferred 111 between the etching subsystem 110 and the first transfer subsystem 150. The COR subsystem 120 can be coupled to the first transfer subsystem 150 and one or more substrates (not shown) can be transferred 121 between the COR subsystem 120 and the first transfer subsystem 150. The deposition subsystem 130 can be coupled to the first transfer subsystem 150 and one or more substrates (not shown) can be transferred 131 between the deposition subsystem 130 and the first transfer subsystem 150. The evaluation subsystem 140 can be coupled to the first transfer subsystem 150 and one or more substrates (not shown) can be transferred 141 between the evaluation subsystem 140 and the first transfer subsystem 150. For example, the etching subsystem 110, the COR subsystem 120, the deposition subsystem 130, the evaluation subsystem 140, and the first transfer subsystem 150 can be part of a Tactras™ System available from Tokyo Electron Limited. In addition, the lithography subsystem 170 can be coupled to the second transfer subsystem 160 and one or more substrates (not shown) can be transferred 172 between the lithography subsystem 170 and the second transfer subsystem 160.

The etching subsystem 110 can comprise one or more storage/transfer elements 112, one or more processing elements 113, and one or more controllers 114. The one or more storage/transfer elements 112 can be coupled to the one or more of the processing elements 113 and can be coupled 111 to the first transfer subsystem 150. In alternate embodiments, one or more of the processing elements 113 may be coupled to the first transfer subsystem 150. The one or more controllers 114 can be coupled to the one or more storage/transfer elements 112 and/or to the one or more processing elements 113.

The COR subsystem 120 can comprise one or more storage/transfer elements 122, one or more processing elements 123, and one or more controllers 124. One or more storage/transfer elements 122 can be coupled to the one or more processing elements 123 and can be coupled 121 to the first transfer subsystem 150. In alternate embodiments, one or more of the processing elements 123 may be coupled to the first transfer subsystem 150. One or more controllers 124 can be coupled to the one or more storage/transfer elements 122 and/or to the one or more processing elements 123.

The deposition subsystem 130 can comprise one or more storage/transfer elements 132, one or more processing elements 133, and one or more controllers 134. The one or more storage/transfer elements 132 can be coupled to the one or more of the processing elements 133 and can be coupled 131 to the first transfer subsystem 150. In alternate embodiments, one or more of the processing elements 133 may be coupled to the first transfer subsystem 150. The one or more controllers 134 can be coupled to the one or more storage/transfer elements 132 and/or to the one or more processing elements 133.

The evaluation subsystem 140 can comprise one or more storage/transfer elements 142, one or more evaluation elements 143, and one or more controllers 144. The one or more storage/transfer elements 142 can be coupled to the one or more of the evaluation elements 143 and can be coupled 141 to the first transfer subsystem 150. In alternate embodiments, one or more of the evaluation elements 143 may be coupled to the first transfer subsystem 150. The one or more controllers 144 can be coupled to the one or more storage/transfer elements 142 and/or to the one or more evaluation elements 143.

Operational state data can be established for the subsystems (110, 120, 130, 140, 150, 160, and 170) and can be used and/or updated by S-O procedures. In addition, operational state data can be established for the storage/transfer elements (112, 122, 132, and 142), processing elements (113, 123, 133, and 143), and transfer elements (154 and 164) and can be updated by S-O procedures. For example, the operational state data for the processing elements can include availability data, matching data for the processing elements, expected processing times for some process steps and/or sites, confidence data and/or risk data for the processing elements, or confidence data and/or risk data for one or more S-O procedure. Updated operational states can be obtained by querying in real-time one or more processing elements, and/or one or more subsystems. Updated loading data can be obtained by querying in real-time one or more transfer elements, and/or one or more transfer subsystems.

The first transfer subsystem 150 can comprise transfer elements 154 that can be coupled to delivery elements (155, 156, and 157). Transfer elements 154 and/or delivery elements (155, 156, and 157) can be used to receive substrates, transfer substrates, align substrates, store substrates, and/or delay substrates. The second transfer subsystem 160 can comprise transfer elements 164 that can be coupled to delivery elements (165, 166, and 167). Transfer elements 164 and/or delivery elements (165, 166, and 167) can be used to receive substrates, transfer substrates, align substrates, store substrates, and/or delay substrates. Alternatively, other transferring means may be used. The first transfer subsystem 150 and the second transfer subsystem 160 can load, transfer, store, and/or unload S-O substrates based on a processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof. For example, the one or more of the transfer element (154 and 164) can be configured for support two or more substrates and for delaying one or more of the S-O substrates for a first amount of time.

The one or more controllers (114, 124, 134, and 144) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, and 190) can be used when performing S-O procedures in real-time, and can be used to exchange one or more Semiconductor Equipment Communications Standard (SECS) messages with the MES 180, read and/or remove information, feed forward, and/or feedback the information, and/or send information as a SECS message. A controller can receive real-time data to update subsystem, processing element, process, recipe, profile, and/or model data. In addition, each controller can include memory (not shown) as required that can be used for storing information and instructions to be executed by the controllers, and may be used for storing temporary variables or other intermediate information during the execution of instructions by the various computers/processors in the processing system 100.

One or more controllers (114, 124, 134, 144, and 190), or other components in the processing system 100 can comprise the means for reading data and/or instructions from a computer readable medium and can comprise the means for writing data and/or instructions to a computer readable medium. The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, and 170) can include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, and 170) can comprise control applications, Graphical User Interface (GUI) components, and/or database components 195. Subsystems (110, 120, 130, 140, and 170), controllers (114, 124, 134, 144, and 190), can include Advanced Process Control (APC) applications, Fault Detection and Classification (FDC), and/or Run-to-Run (R2R) applications. In some embodiments, APC applications, FDC applications, and/or R2R applications can be performed.

Output data and/or messages from S-O procedures can be used in subsequent procedures to optimize the process accuracy and precision. Data can be passed to S-O procedures in real-time as real-time variable parameters, overriding current model default values and narrowing the search space for resolving accurate results. Real-time data can be used with a library-based system, or regression-based system, or any combination thereof to optimize an S-O procedure.

In some embodiments, the evaluation subsystem 140 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The evaluation subsystem 140 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. An exemplary optical metrology system is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals can be generated by applying Maxwell's equations and using a numerical analysis technique to solve Maxwell's equations. For example, various numerical analysis techniques, including variations of rigorous coupled wave analysis (RCWA), can be used with multilayer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

An alternative procedure for generating a library of simulated-diffraction signals can include using a machine learning system (MLS). Prior to generating the library of simulated-diffraction signals, the MLS is trained using known input and output data. For example, the MLS may be trained with a subset of the S-O library data. In one exemplary embodiment, simulated diffraction signals can be generated using a MLS employing a machine learning algorithm, such as back-propagation, radial basis function, support vector, kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

For detailed description of metrology model optimization, refer to U.S. patent application Ser. No. 10/206,491, OPTIMIZED MODEL AND PARAMETER SELECTION FOR OPTICAL METROLOGY, by Vuong, et al., filed Jun. 27, 2002; Ser. No. 10/946,729, OPTICAL METROLOGY MODEL OPTIMIZATION BASED ON GOALS, by Vuong, et al., filed Sep. 21, 2004; and U.S. patent application Ser. No. 11/061,303, OPTICAL METROLOGY OPTIMIZATION FOR REPETITIVE STRUCTURES, by Vuong, et al., filed on Apr. 27, 2004, all of which are incorporated herein by reference in their entireties.

When a regression-based process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, issued on Aug. 31, 2004, which is incorporated herein by reference in its entirety.

When a library-based process is used, an optical metrology data library can be generated and/or enhanced using S-O procedures, recipes, profiles, and/or models. For example, an S-O evaluation library can comprise simulated and/or measured optical signals and corresponding set of profile parameters. A detailed description of generating optical metrology data such as a library of simulated diffraction signals and corresponding set of profile parameters is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference. The regression-based and/or the library-based process can include S-O procedures.

One or more of the controllers (114, 124, 134, 144, and 190) can perform APC, R2R, FDC, and/or procedures that can operate as control strategies, control plans, control models, and/or recipe managers. Control and/or analysis strategies/plans can cover multiple process steps within a substrate processing sequence, and can be used to analyze the real-time and/or historical data, and establish error conditions. An S-O analysis procedure can be executed when a context is matched. An S-O data collection plan and/or analysis plan can reject the data at one or more of the evaluation sites for a substrate or reject the data because an S-O procedure fails. For example, dynamic context matching allows for custom configuration at each device and/or product, and an S-O procedure can indicate a failure when a limit is exceeded or a rule is violated. Successful procedures can create warning messages when limits are being approached. Pre-specified failure actions for procedures errors can be stored in a database, and can be retrieved from the database when an error occurs.

The processing elements (113, 123, 133, and 143) can process, measure, inspect, align, and/or store one or more substrates using S-O procedures and/or other procedures. One or more of the storage/transfer elements (112, 122, 132, and 142), the first transfer subsystem 150, and/or the second transfer subsystem 160 can transfer, measure, inspect, align, and/or store one or more substrates using S-O procedures and/or other procedures.

In some S-O sequences, the lithography subsystem 170 can perform coating procedures, thermal procedures, measurement procedures, inspection procedures, alignment procedures, and/or storage procedures on one or more substrates using procedures and/or procedures. For example, one or more lithography-related processes can be used to deposit one or more masking layers that can include photoresist material, and/or anti-reflective coating (ARC) material, can be used to develop protoresist material, and can be used to thermally process (bake) one or more of the masking layers. In addition, lithography subsystem 170 can be used to measure and/or inspect one or more of the masking layers and/or substrates.

In other embodiments, the lithography subsystem 170 can be used to perform wet and/or dry exposure procedures, and in other cases, the lithography subsystem 170 can be used to perform extreme ultraviolet (EUV) exposure procedures. Alternatively, lithography related subsystems, such as scanner subsystems, may be used.

The deposition subsystem 130 can comprise one or more processing elements 133 that can process, measure, inspect, align, and/or store one or more substrates. The storage/transfer element 132, the first transfer subsystem 150, and/or the second transfer subsystem 160 can transfer, measure, inspect, align, and/or store one or more substrates. In some embodiments, the deposition subsystem 130 can comprise one or more processing elements 133 that can perform deposition procedures, inspection procedures, measurement procedures, alignment procedures, and/or storage procedures on one or more substrates using procedures and/or procedures. For example, one or more of the processing elements 133 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The evaluation subsystem 140 can comprise one or more evaluation elements 143 that can evaluate, measure, inspect, align, verify, and/or store one or more substrates. One or more of the evaluation elements 143 and/or the storage/transfer elements 142 can transfer, measure, inspect, align, and/or store one or more substrates. In some embodiments, the evaluation subsystem 140 can perform evaluation procedures, inspection procedures, temperature control procedures, measurement procedures, alignment procedures, verification procedures, and/or storage procedures on one or more substrates. For example, one or more of the evaluation elements 143 can be used to perform real-time optical metrology procedures that can be used to measure gate structures and/or thicknesses on the substrate. In addition, evaluation subsystem 140 can be used to determine substrate curvature or to measure and/or inspect one or more surfaces of the substrates. The evaluation subsystem 140 can perform evaluation procedures to determine if the substrate has been processed correctly or if a rework procedure is required.

In some embodiments, one or more of the subsystems (110, 120, 130, 140, and 170) can perform cleaning procedures, etching procedures, layer removal procedures, ashing procedures, inspection procedures, residue removal procedures, measurement procedures, alignment procedures, and/or storage procedures on one or more substrates using reworking procedures. For example, material can be removed from one or more patterned substrates using one or more plasma etching procedures, and/or non-plasma etching procedures. In addition, one or more processing subsystems can be used to remove damaged material from one or more of the substrates. Each subsystem can process one or more substrates in parallel, and one or more procedures and/or procedures can be performed.

One or more of the formatted messages can be exchanged between subsystems. The controllers can process messages and extract new data. When new data is available, a controller can either use the new data to update an S-O recipe, profile, and/or model currently being used for the substrate and/or lot. When the controller uses the new data to update recipe data, profile data, and/or modeling data for the substrate lot currently being processed, the controller can determine if a recipe, a profile, and/or a model can be updated before the current substrate is processed. The current substrate can be processed using the updated recipe, profile, and/or model when the recipe, profile, and/or model can be updated before the current substrate is processed. The current substrate can be processed using a non-updated recipe, profile, and/or model when the data cannot be updated before the current substrate is processed. For example, when a new etching recipes, profiles, and/or models are available, an etching subsystem and/or etching controller may determine when to use the new etching recipes, profiles, and/or models. One or more controllers can use CD data, thermal data, thickness data, uniformity data, timing data, delay data, or optical properties data, or any combination thereof can be used to update an etching recipe, an etching profile, and/or an etching model.

One or more S-O procedures can provide damage-assessment data that can include data for damaged spacer layers, features, and/or structures for different sites, substrates, and/or lots. One or more processing subsystems can use the damage-assessment data to update, and/or optimize processing recipe data, process profile data, and/or modeling data. For example, the etching subsystem 110 can use "protection layer" data to update, and/or optimize an etching chemistry and/or etching time.

S-O procedures can be used to create, modify, and/or evaluate isolated and/or nested structures at different times and/or sites. For example, spacer and/or substrate thickness data can be different near isolated and/or nested structures, and spacer and/or substrate thickness data can be different near open areas and/or trench array areas. A processing subsystem can use new data for isolated and/or nested structures to update and/or optimize a process recipe and/or process time.

S-O procedures can use end-point detection (EPD) data and process time data to improve the accuracy. When EPD data is used to stop an etching procedure, the EPD time data and the process rate data can be used to estimate the amount of etch and/or to estimate a spacer thickness.

The data associated with an evaluation subsystem 140 can include measured, predicted, and/or simulated signals associated with patterned structures or un-patterned structures, and the signals can be stored using processing, substrate, lot, recipe, site, or substrate location data. This data can also include variables associated with measurement devices, metrology devices, inspection devices and the like. For example, device parameters can include bandwidth, wavelength, intensity, angle of incidence, and/or azimuth angle. Optical data can include refractive index (n) data and extinction coefficient (k) data)

In some embodiments, S-O procedures can use measured, predicted, and/or simulated diffraction signals to optimize an optical metrology procedure, structure, and/or model. In some examples, the library data can indexed with respect to products, devices, substrates, procedures, lots, recipes, sites, locations, patterned and/or un-patterned structures.

Intervention and/or judgment rules can be defined in a strategy, plan, model, subsystem, element, or procedure and can be assigned to execute whenever a matching context is encountered. The intervention and/or judgment rules can be established for various S-O procedures and can be maintained in the database. When judgment and/or intervention rules are associated with S-O procedures, they can be executed. Intervention and/or judgment rules and/or limits can be performed based on historical procedures, on the customer's experience, or process knowledge, or obtained from a host computer. S-O-based rules can be used in FDC procedures to determine how to respond to alarm conditions, error conditions, fault conditions, and/or warning conditions. The S-O-based FDC procedures can prioritize and/or classify faults, predict system performance, predict preventative maintenance schedules, decrease maintenance downtime, and extend the service life of consumable parts in the system. Various actions can take place in response to an alarm/fault during an S-O procedure, and the actions taken on the alarm/fault can be context-based. S-O-based context can be specified by a rule, a system/process recipe, a chamber type, identification number, load port number, cassette number, lot number, control job ID, process job ID, slot number and/or the type of data.

In some examples, the MES 180 may be configured to monitor some system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide configuration information and update information. Data can be exchanged using SEMI Equipment Communications Standard/Generic Equipment Model (SECS/GEM) communications protocols.

In some examples, a transfer system can use loading data to determine where to transfer a substrate. In other examples, a transfer system can use processing sequence data to determine where to transfer a substrate. In still other examples, a transfer system can use confidence data to determine where to transfer a substrate. Alternatively, other procedures may be used.

In various embodiments, one or more input messages can be received and/or processed by one or more of the controllers (114, 124, 134, 144, and 190), and one or more output messages can be created and/or sent by one or more of the controllers. In some examples, an input message can be a formatted message comprising real-time data and historical data. A controller can process a formatted message to create a message and/or a separate message for a subsystem. The message can include substrate data that can be used to reduce search times in libraries and databases, to reduce calculation errors, and to improve accuracy. For example, a smaller profile space within a library space can be identified using the S-O data. In addition, S-O data can be used and can allow an iODP procedure to determine S-O profiles from the profile library in real-time, thereby decreasing measurement time and increasing throughput. The controller can examine the input message in real time to determine when the input message includes an S-O message and/or data that it can use. In addition, the controller can determine how to extract in real-time the S-O message and/or data. Messages can use Extensible Markup Language (XML) format and/or Standard Machine Language (SML) format. The system can provide and manage exception handling with messages that are being sent, split, and/or parsed for multiple subsystem One or more of the controllers (114, 124, 134, 144, and 190) can be configured for determining substrate data for each substrate, for determining one or more S-O procedures using historical data and/or the real-time data, for establishing one or more S-O procedures, for establishing a first number of substrates to be processed using the S-O procedure, for determining operational state data for the one or more subsystems (110, 120, 130, 140, 150, 160, and 170), for determining loading data for the one or more transfer elements (154, 164) in the one or more transfer subsystems (150, 160).

In some embodiment, one or more of the transfer subsystems (150, 160) can be configured to transfer one or more substrates to one or more of the lithography subsystems 170. After the one or more substrates are transferred, one or more lithography-related procedures can be performed and a patterned masking layer can be created on one or more of the substrates. The patterned masking layer can be used in gate creation procedures, gate optimization procedures, ionization procedures, doping procedures, etching procedures.

When one or more spacer layers are deposited using a first deposition chamber, chamber-matching data can be obtained for the first deposition chamber, and when one or more spacer layers are deposited using a second deposition chamber, chamber-matching data can be obtained for the second deposition chamber. One or more first chamber-matching values can be determined for one or more of the deposition chambers using the chamber-matching data for the first deposition chamber and/or the chamber-matching data for the second deposition chamber.

When one or more of the deposited spacer layers are partially-etched in a first etch chamber, chamber-matching data can be obtained for the first etch chamber, and when one or more deposited spacer layers are partially-etched using a second etch chamber, chamber-matching data can be obtained for the second etch chamber. One or more second chamber-matching values can be determined for one or more of the etch chambers using the chamber-matching data for the first etch chamber and/or the chamber-matching data for the second etch chamber.

When one or more of the partially-etched spacer layers are COR-etched in a first COR-etch chamber, chamber-matching data can be obtained for the first COR-etch chamber, and when one or more partially-etched spacer layers are COR-etched using a second COR-etch chamber, chamber-matching data can be obtained for the second COR-etch chamber. One or more third chamber-matching values can be determined for one or more of the COR-etch chambers using the chamber-matching data for the first COR-etch chamber and/or the chamber-matching data for the second COR-etch chamber.

In addition, chamber-matching procedures can be performed using the evaluation subsystems 140 and the S-O evaluation library can be updated in real-time using the chamber-matching data when library creation rules are not violated. For example, one or more "golden substrates" or reference chips can be stored and used periodically to verify the performance of one or more evaluation elements 143.

In various examples, deposition procedure limits can be obtained by performing the deposition procedure in a "golden" processing chamber, can be historical data that is stored in a library, can be obtained by performing a verified deposition procedure, can be obtained from the MES 180, can be simulation data, and can be predicted data. Partial-etch procedure limits can be obtained by performing the partial-etch procedure in a "golden" processing chamber, can be historical data that is stored in a library, can be obtained by performing a verified partial-etch procedure, can be obtained from the MES 180, can be simulation data, and can be predicted data. COR-etch procedure limits can be obtained by performing the COR-etch procedure in "golden" processing chambers, can be historical data that is stored in a library, can be obtained by performing a verified COR-etch procedure, can be obtained from the MES 180, can be simulation data, and can be predicted data.

Multi-input multi-output (MIMO) models can be established and/or used to predict product requirement data for one or more deposited layers. Some MIMO models can be established and/or used to predict thickness and/or uniformity data for one or more deposited layers using measurement data for a gate layer. Other MIMO models can be established and/or used to predict thickness and/or uniformity data for one or more partially-etched layers using measurement data for a gate layer, or measurement data from a deposited layer. Additional MIMO models can be established and/or used to predict thickness and/or uniformity data for one or more COR-etched layers using measurement data for a gate layer, measurement data from a deposited layer, or measurement data from a partially-etched layer, or any combination thereof.

In some examples, spacer layer material can be deposited on first and second substrates using a first deposition procedure or an updated/modified first deposition procedure. Real-time deposition data can be obtained for the first and second substrates, and deposition-related correction data can be determined using one or more of the differences between the historical deposition data and the real-time deposition data from the first and/or second substrates. The deposition-related correction data can be used to update the first deposition procedure when the deposition-related correction data is less than or equal to a deposition-related correction limit. Next, the spacer layer on first and second deposition substrates can be partially-etched using a partial-etch procedure or an updated/modified partial-etch procedure. Real-time partial-etch data can be obtained for the first and second partially-etched substrates, and partial-etch correction data can be determined using the difference between the historical partial-etch data and the real-time partial-etch data from the first and/or second partially-etched substrates. The partial-etch correction data can be used to update the partial-etch procedure when the partial-etch correction data is less than or equal to a partial-etch correction limit. Then, the partially-etched spacer layer on first and second partially-etched substrates can be COR-etched using a COR-etch procedure or an updated/modified COR-etch procedure. Real-time COR-etch data can be obtained for the first and second COR-etched substrates, and COR-etch correction data can be determined using the difference between the historical COR-etch data and the real-time COR-etch data from the first and/or second COR-etched substrates. The COR-etch correction data can be used to update the first COR-etch procedure when the COR-etch correction data is less than or equal to a COR-etch correction limit. In addition, the deposition-related correction data, the partial-etch correction data, and the COR-etch correction data can be fed forward or fed back as required.

FIGS. 2A-2F show exemplary block diagrams of etching subsystems in accordance with embodiments of the invention.

Figure 2A:
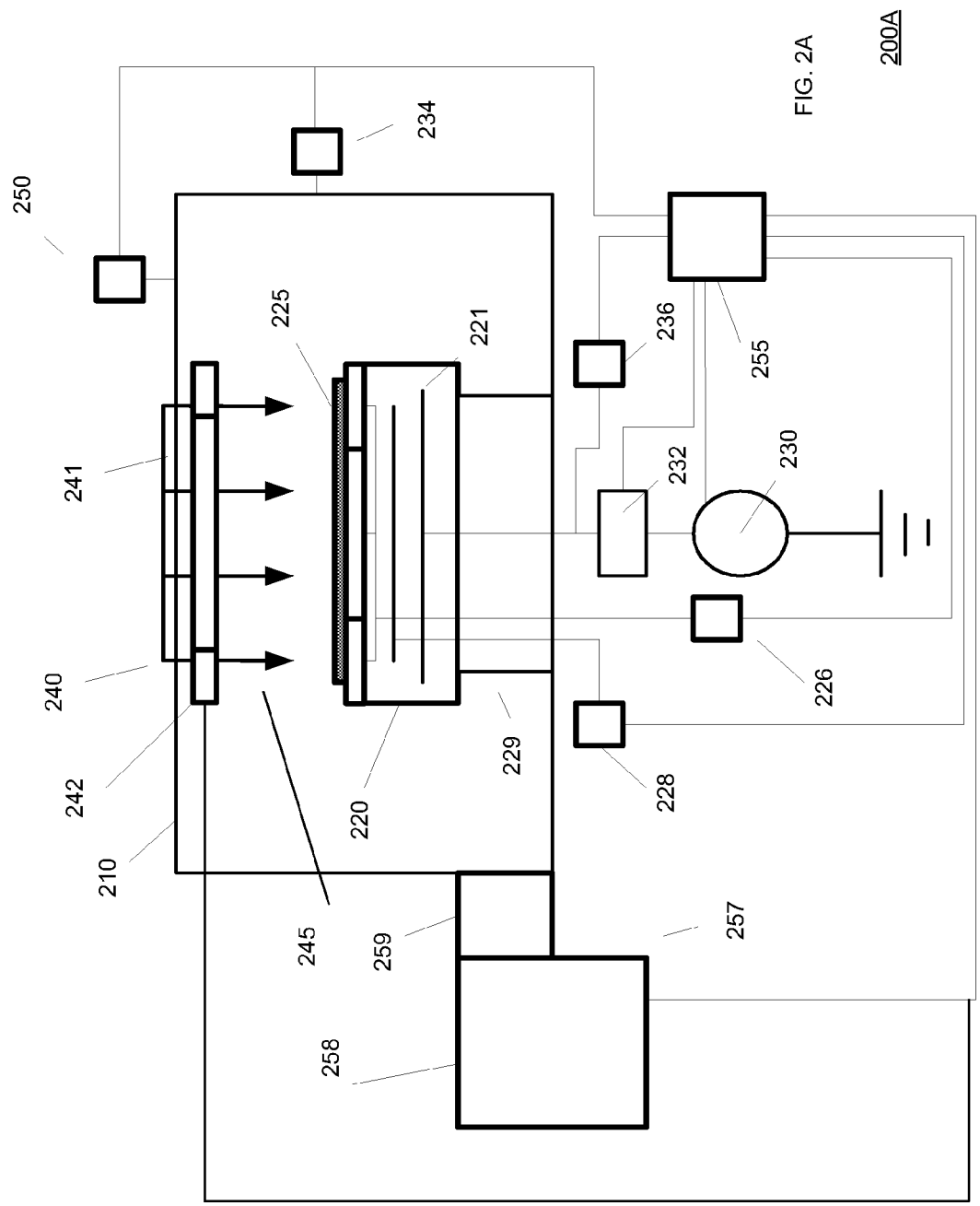

A first exemplary etching subsystem 200A is shown in FIG. 2A, and the illustrated etching subsystem 200A includes plasma processing chamber 210, substrate holder 220, upon which a substrate 225 to be processed is affixed, gas injection system 240, and vacuum pumping system 257. For example, substrate holder 220 can be coupled to and insulated from plasma processing chamber 210 using base 229. Substrate 225 can be, for example, a semiconductor substrate, a work piece, or a liquid crystal display (LCD). For example, plasma processing chamber 210 can be configured to facilitate the generation of plasma in processing region 245 adjacent a surface of substrate 225, where plasma is formed via collisions between heated electrons and an ionizable gas. An ionizable gas or mixture of gases is introduced via gas injection system 240, and process pressure is adjusted. Desirably, plasma is utilized to create materials specific to a predetermined material process, and to aid either the deposition of material to substrate 225 or the removal of material from the exposed surfaces of substrate 225. For example, controller 255 can be used to control vacuum pumping system 257 and gas injection system 240.

Substrate 225 can be, for example, transferred into and out of plasma processing chamber 210 through a slot valve (not shown) and chamber feed-through (not shown) via robotic transfer system where it is received by substrate lift pins (not shown) housed within substrate holder 220 and mechanically translated by devices housed therein. After the substrate 225 is received from transfer system, it is lowered to an upper surface of substrate holder 220.

For example, substrate 225 can be affixed to the substrate holder 220 via an electrostatic clamping system (not shown). Furthermore, substrate holder 220 can further include a temperature control system 228. Moreover, gas can be delivered to the backside of the substrate via a dual (center/edge) backside gas system 226 to improve the gas-gap thermal conductance between substrate 225 and substrate holder 220. A dual (center/edge) backside gas system can be utilized when additional temperature control of the substrate is required at elevated or reduced temperatures. For example, temperature control of the substrate can be useful at temperatures in excess of the steady-state temperature achieved due to a balance of the heat flux delivered to the substrate 225 from the plasma and the heat flux removed from substrate 225 by conduction to the substrate holder 220. In other embodiments, heating elements, such as resistive heating elements, or thermoelectric heaters/coolers can be included.

As shown in FIG. 2A, substrate holder 220 includes a lower electrode 221 through which Radio Frequency (RF) power can be coupled to plasma in processing region 245. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz. (if we count RLSA we are 2.45 GHz to 6 GHz)

Alternatively, RF power may be applied to the lower electrode 221 at multiple frequencies. Furthermore, impedance match network 232 serves to maximize the transfer of RF power to plasma in processing chamber 210 by minimizing the reflected power. Various match network topologies and automatic control methods can be utilized.

With continuing reference to FIG. 2A, process gas can be introduced to processing region 245 through gas injection system 240. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 240 can be configured to reduce or minimize the introduction of contaminants to substrate 225 and can include a gas injection plenum 241, and a multi-orifice showerhead gas injection plate 242. For example, process gas can be supplied from a gas delivery system (not shown). Gas injection system 240 can provide different flow rates to different regions of the processing region 245. Alternatively, gas injection system 240 may provide different process gasses to different regions of the processing region 245.

For example, vacuum pumping system 257 can include a turbo-molecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, etching subsystem 200A can include one or more sensors 250 coupled to plasma processing chamber 210 to obtain performance data, and controller 255 coupled to the sensors 250 to receive performance data. The sensors 250 can include both sensors that are intrinsic to the plasma processing chamber 210 and sensors extrinsic to the plasma-processing chamber 210. Intrinsic sensors can include those sensors pertaining to the functionality of plasma processing chamber 210 such as the measurement of the Helium backside gas pressure, Helium backside flow, electrostatic clamping (ESC) voltage, ESC current, substrate holder 220 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include one or more optical devices 234 for monitoring the light emitted from the plasma in processing region 245 as shown in FIG. 2A, and/or one or more electrical measurement devices 236 for monitoring the electrical system of plasma processing chamber 210 as shown in FIG. 2A. The optical devices 234 can include an optical sensor that can be used as an End Point Detector (EPD) and can provide EPD data. For example, an Optical Emissions Spectroscopy (OES) sensor may be used.

The electrical measurement device 236 can include a current and/or voltage probe, a power meter, or spectrum analyzer. For example, electrical measurement devices 236 can include a RF Impedance analyzer. Furthermore, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. In alternate embodiments, electrical measurement device 236 can include a broadband RF antenna useful for measuring a radiated RF field external to plasma processing chamber 210.

Controller 255 includes a microprocessor, memory, and a digital I/O port (potentially including D/A and/or A/D converters) capable of generating control voltages sufficient to communicate and activate inputs to etching subsystem 200 as well as monitor outputs from etching subsystem 200. As shown in FIG. 2A, controller 255 can be coupled to and exchange information with first RF generator 230, impedance match network 232, gas injection system 240, vacuum pumping system 257, backside gas delivery system 226, temperature control system 228, optical device 234, electrical measurement device 236, and sensors 250. A program stored in the memory is utilized to interact with the aforementioned components of an etching subsystem 200 according to a stored process recipe.

In the exemplary embodiment shown in FIG. 2B, the etching subsystem 200B can be similar to the embodiment of FIG. 2A and further comprise either a stationary, or mechanically or electrically rotating magnetic field system 260, in order to potentially increase plasma density and/or improve plasma processing uniformity, in addition to those components described with reference to FIG. 2A. Moreover, controller 255 can be coupled to magnetic field system 260 in order to regulate the speed of rotation and field strength. The design and implementation of a rotating magnetic field is well known to those skilled in the art.

Figure 2B:
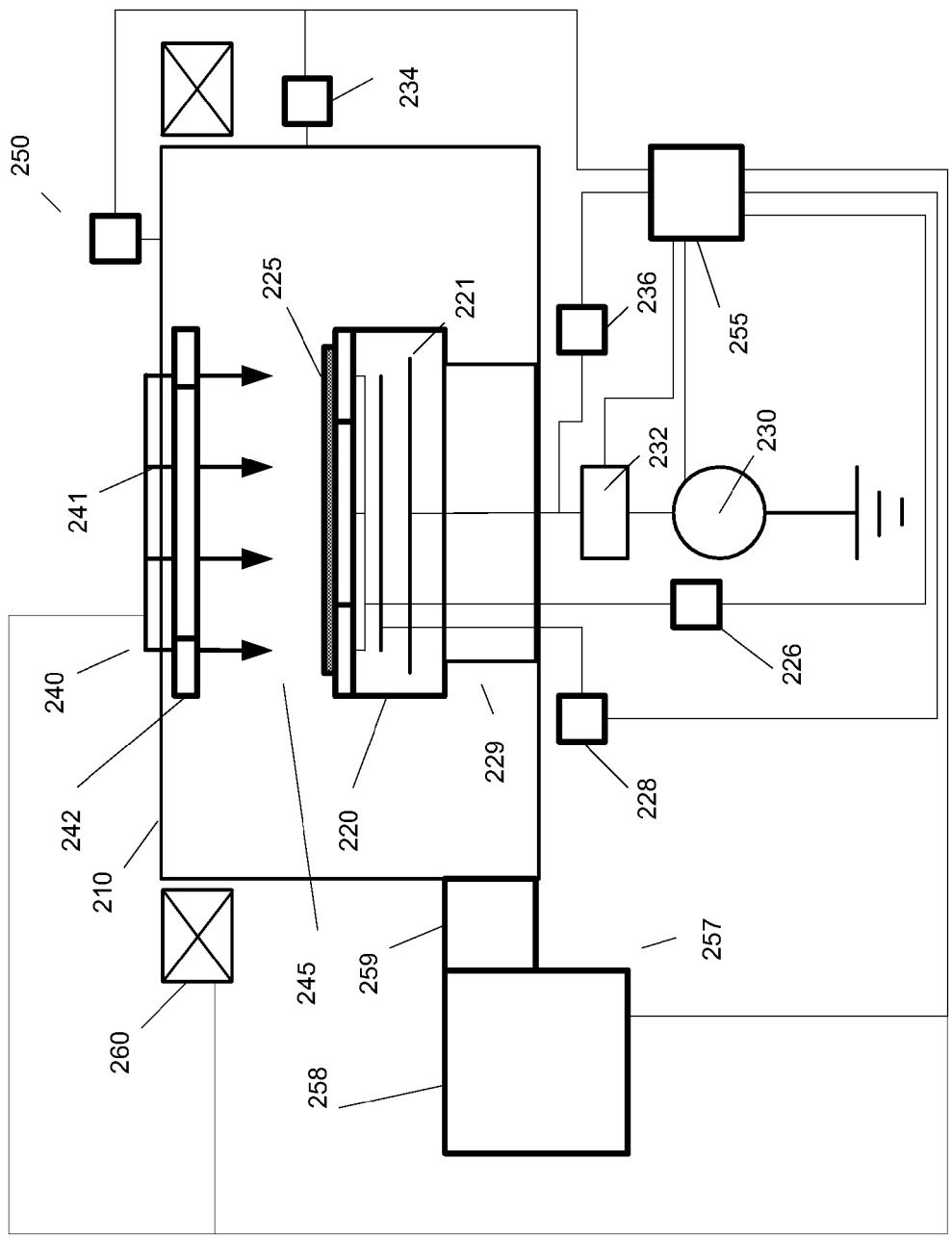

In the embodiment shown in FIG. 2C, the etching subsystem 200C can be similar to the embodiment of FIG. 2A or FIG. 2B, and can further comprise an upper electrode 270 to which RF power can be coupled from RF generator 272 through optional impedance match network 274. A frequency for the application of RF power to the upper electrode can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The design and implementation of an upper electrode is well known to those skilled in the art. The upper electrode 270 and the gas distribution system 240 can be coupled to each other as shown.

Figure 2D:
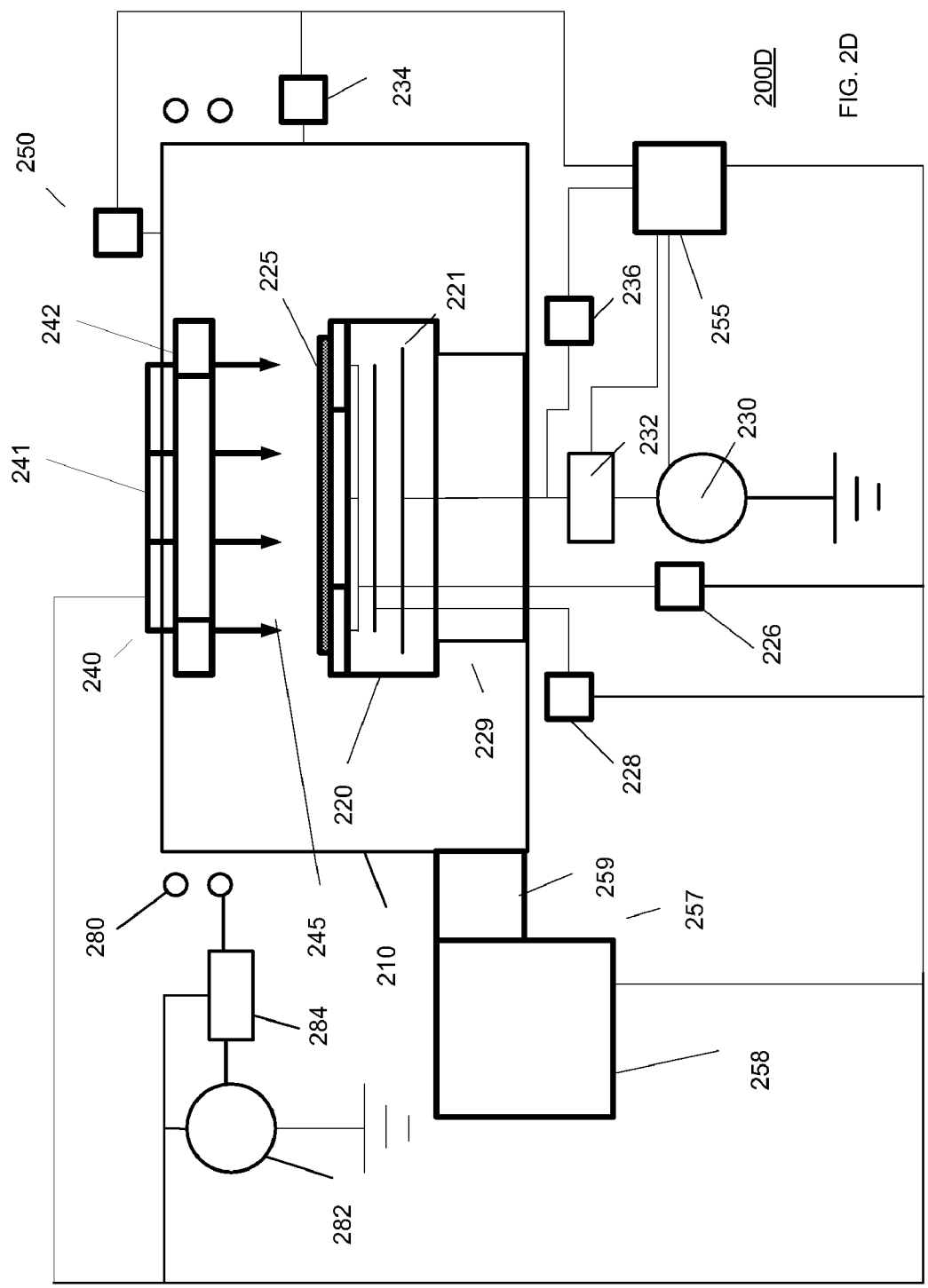

In the embodiment shown in FIG. 2D, the etching subsystem 200D can be similar to the embodiments of FIGS. 2A and 2B, and can further comprise an inductive coil 280 to which RF power can be coupled via RF generator 282 through optional impedance match network 284. RF power is inductively coupled from inductive coil 280 through a dielectric window (not shown) to plasma processing region 245. A frequency for the application of RF power to the inductive coil 280 can range from about 10 MHz to about 100 MHz. Similarly, a frequency for the application of power to the lower electrode 221 can range from about 0.1 MHz to about 100 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

Figure 2E:
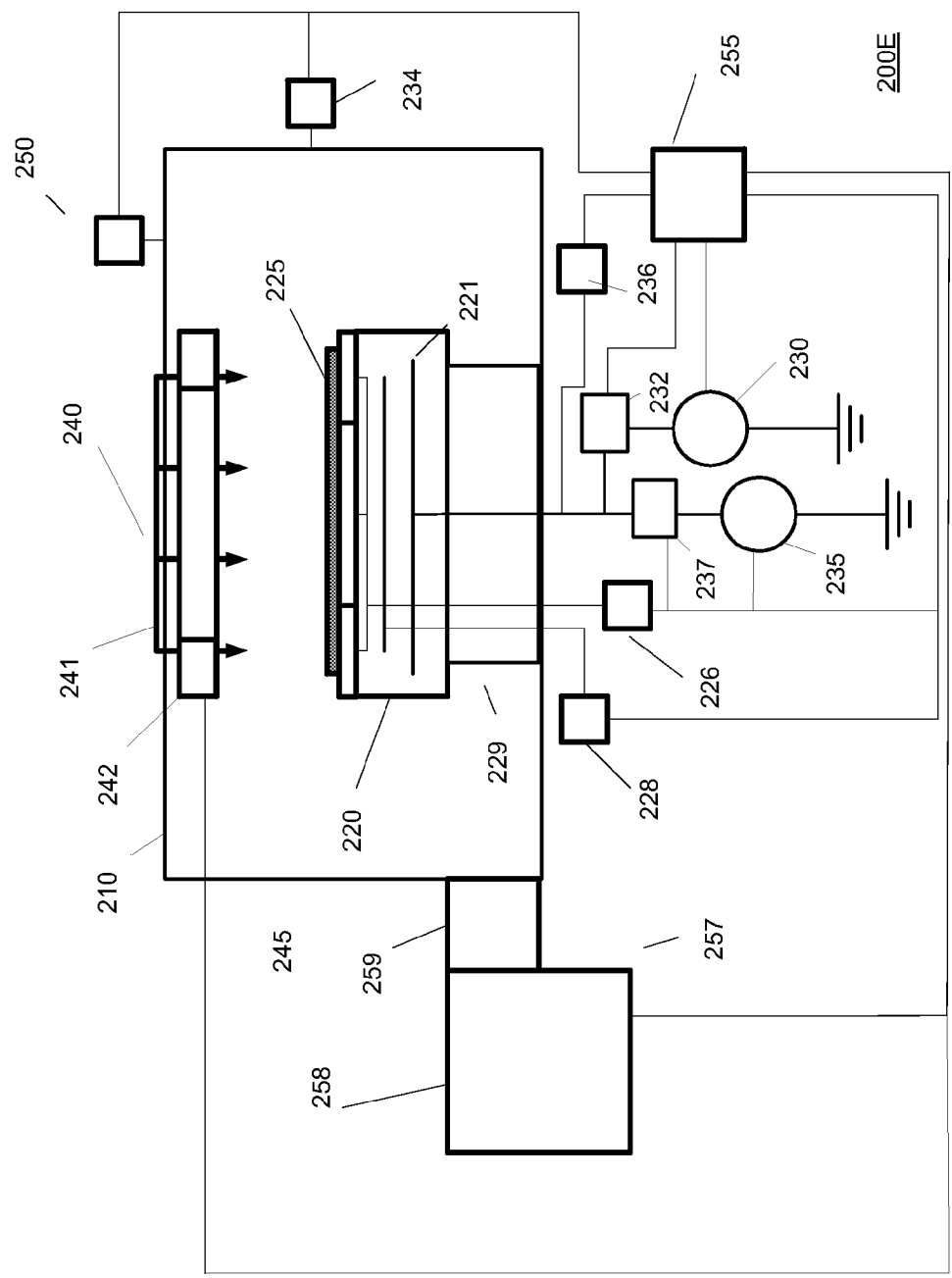
Figure 3A:
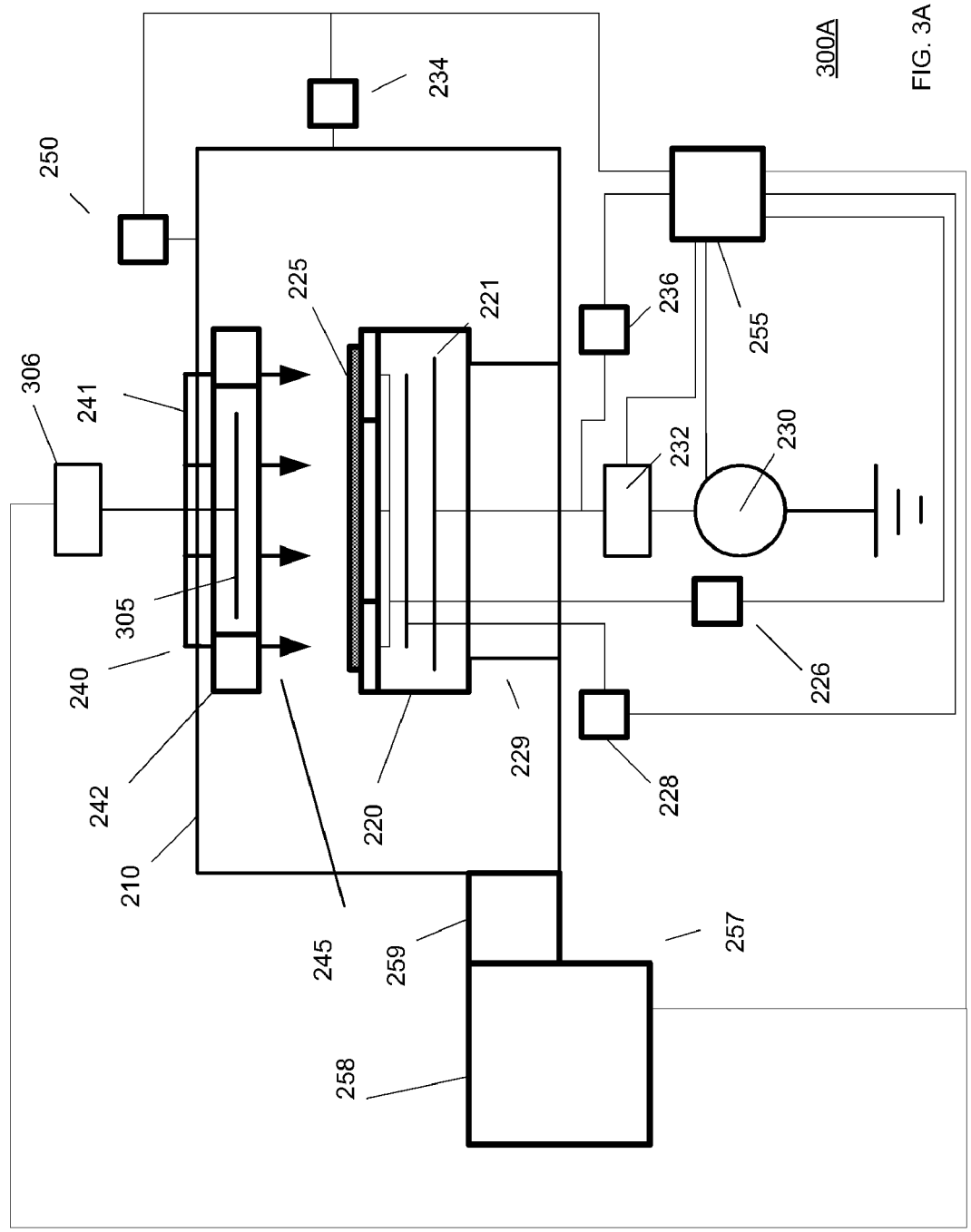
Figure 3B:
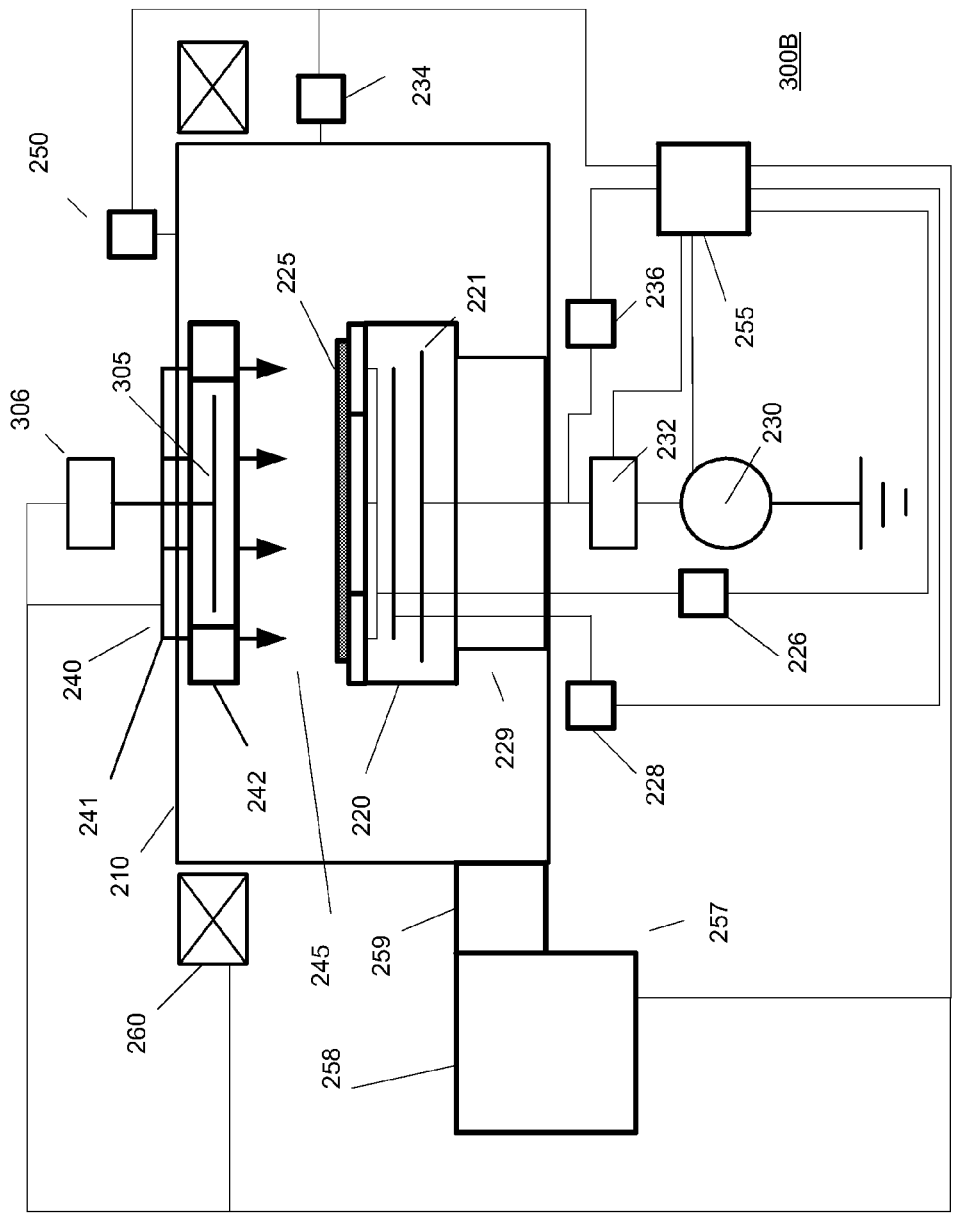
Figure 3D:
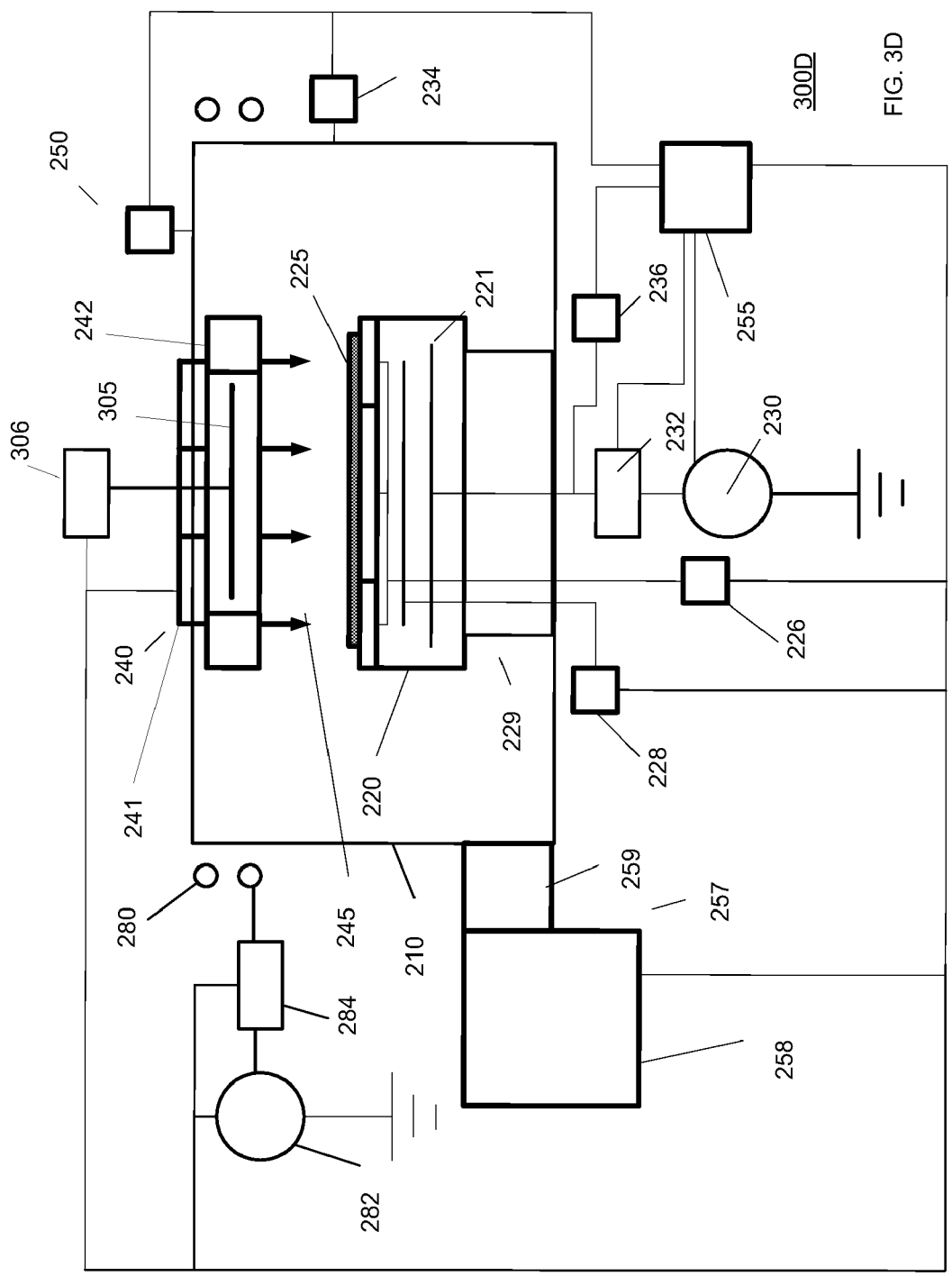
Figure 3E:
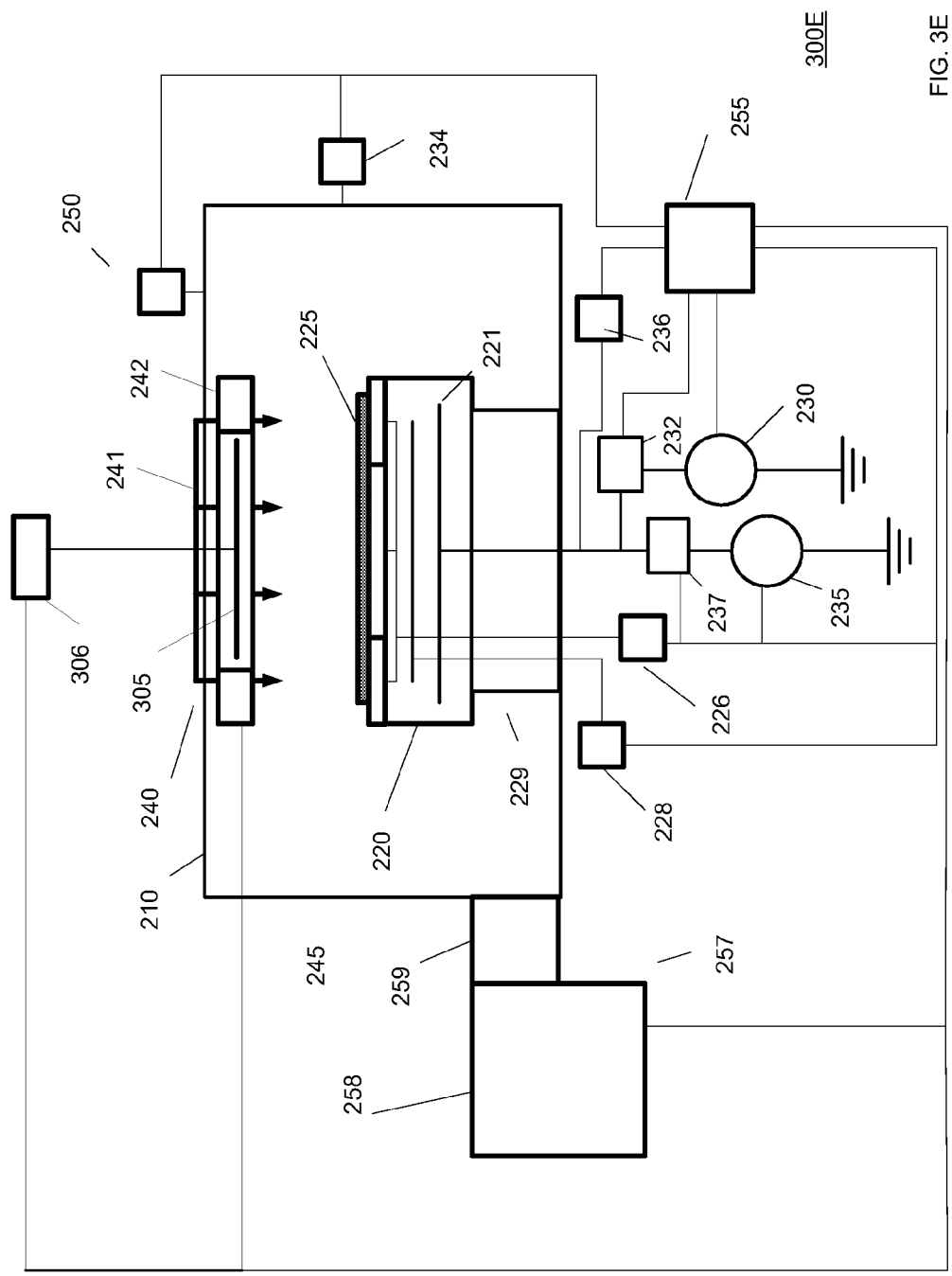
Figure 3F:
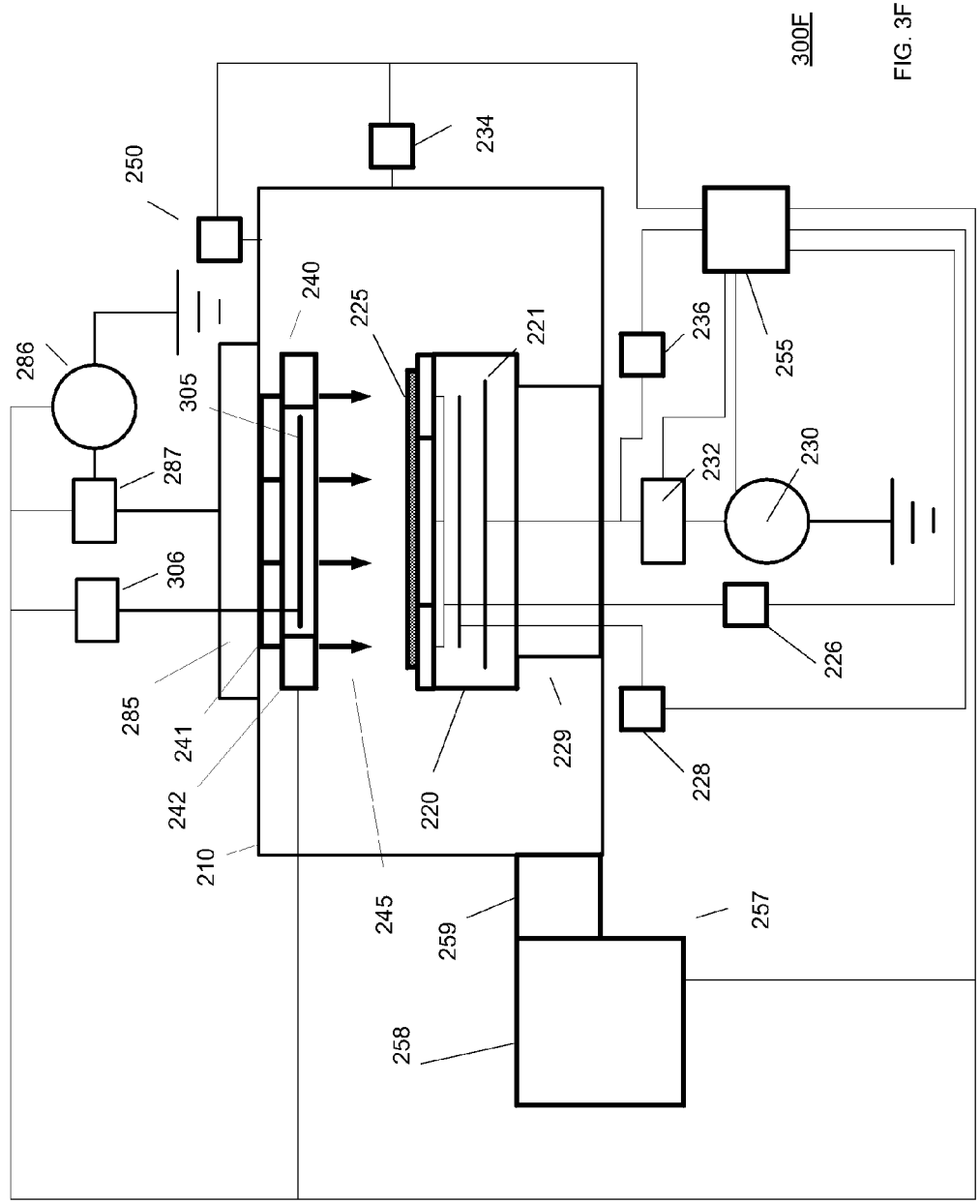

In the embodiment shown in FIG. 2E, the etching subsystem 200E can, for example, be similar to the embodiments of FIGS. 2A, 2B, 2C, and 2D, and can further comprise a second RF generator 235 configured to couple RF power to substrate holder 220 through another optional impedance match network 237. A typical frequency for the application of RF power to substrate holder 220 can range from about 0.1 MHz to about 200 MHz for either the first RF generator 230 or the second RF generator 235 or both. The RF frequency for the second RF generator 235 can be relatively greater than the RF frequency for the first RF generator 230. Furthermore, the RF power to the substrate holder 220 from the first RF generator 230 can be amplitude modulated, the RF power to the substrate holder 220 from the second RF generator 235 can be amplitude modulated, or both RF powers can be amplitude modulated. Desirably, the RF power at the higher RF frequency is amplitude modulated. Moreover, controller 255 can be coupled to the second RF generator 235 and impedance match network 237 in order to control the application of RF power to substrate holder 220. The design and implementation of an RF system for a substrate holder is well known to those skilled in the art.

In the embodiment shown in FIG. 2F, the etching subsystem 200F can be similar to the embodiments of FIGS. 2A and 2E, and can further comprise a surface wave plasma (SWP) source 285. The SWP source 285 can comprise a slot antenna, such as a radial line slot antenna (RLSA), to which microwave power is coupled via microwave generator 286 through optional impedance match network 287.

FIGS. 3A-3F show additional embodiments for etching subsystems in accordance with embodiments of the invention. FIGS. 3A-3F illustrate exemplary etching subsystems 300A-300F that are similar to the exemplary etching subsystems 200A-200F shown in FIGS. 2A-2F, but etching subsystems 300A-300F include at least one DC electrode 305 and at least one DC source 306.

During patterned etching, a dry plasma etching process is often utilized, and the plasma is formed from a process gas by coupling electromagnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the plasma processing system in order to create an energetic (ballistic) electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1; the entire contents of which are herein incorporated by reference in their entirety. In general, the ballistic electron beam can be implemented within various types of plasma processing system, as shown in FIGS. 3A-3F.

The DC electrode 305 may comprise a silicon-containing material and/or a doped silicon-containing material. The DC source 306 can include a variable DC power supply. Additionally, the DC source 306 can include a bipolar DC power supply. The DC source 306 can further include a system configured to perform at least one of monitoring, adjusting, or controlling the polarity, current, voltage, and/or on/off state of the DC source 306. Once plasma is formed, the DC source 306 facilitates the formation of a ballistic electron beam. An electrical filter may be utilized to de-couple RF power from the DC source 306.

For example, the DC voltage applied to DC electrode 305 by DC source 306 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

Figure 4:
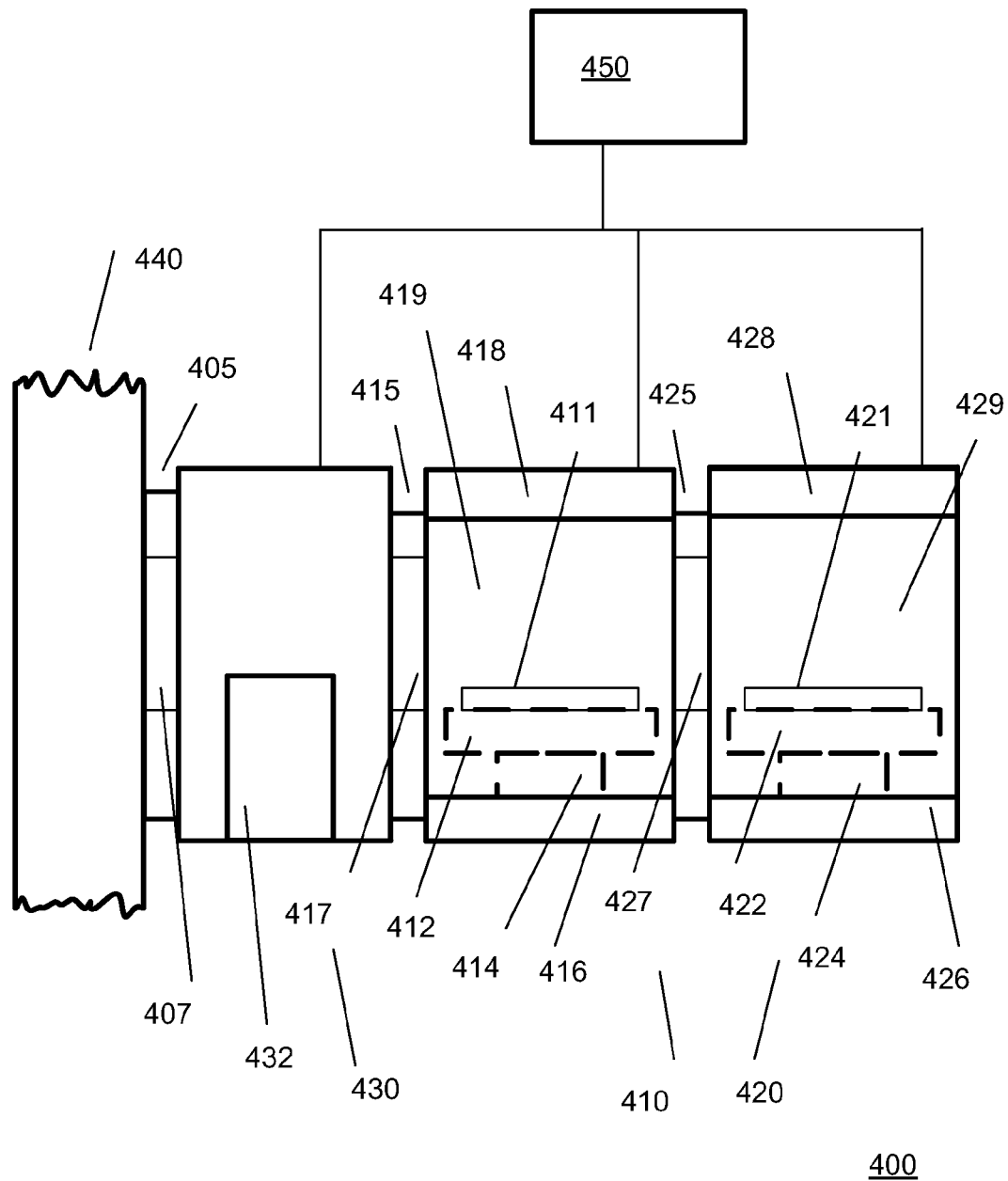
FIG. 4 shows an exemplary block diagram of a trimming subsystem in accordance with embodiments of the invention.

FIG. 4 shows an exemplary block diagram of a trimming subsystem in accordance with embodiments of the invention. In the illustrated embodiment, a chemical oxide removal (COR) subsystem 400 is shown, and the COR system can be used for layer trimming. The COR subsystem 400 comprises a chemical treatment module 410, a thermal treatment module 420, and a transfer module 430. Alternatively, the COR subsystem 400 may comprise a substrate rinsing system (not shown). The transfer module 430 can be coupled to the chemical treatment module 410 and can comprise an internal transfer element 432. Alternatively, other configurations may be used. The internal transfer element 432 can be used to transfer substrates into and out of the chemical treatment module 410, and exchange substrates with a multi-element manufacturing system 440. In addition, internal transfer element 432 can be used to transfer substrates through the chemical treatment module 410 into and out of the thermal treatment module 420. For example, the chemical treatment module 410, the thermal treatment module 420, and the transfer module 430 can be included in a processing system such as the Tactras™ System or Certas System (a chemical treatment sub-system) from Tokyo Electron Limited. The multi-element manufacturing system 440 can comprise etch systems, deposition systems, coating systems, patterning systems, integrated metrology systems, etc. In order to isolate the processes occurring in the chemical treatment module 410, the thermal treatment module 420, and the transfer module 430, isolation assemblies (405, 415, and 425) can be utilized to couple the subsystems to each other. For instance, the isolation assemblies (405, 415, and 425) can provide thermal isolation and can include gate valve assemblies (407, 417, and 427) to provide vacuum isolation. Alternatively, the chemical treatment module 410, the thermal treatment module 420, and the transfer module 430 can be configured differently.

In general, at least one of the chemical treatment module 410, the thermal treatment module 420, and the transfer module 430 comprises at least two transfer openings to permit the passage of the substrate therethrough. For example, as depicted in FIG. 4, the chemical treatment module 410 can comprise two transfer openings, the first transfer opening permits the passage of the substrate between the chemical treatment module 410 and the transfer module 430 and the second transfer opening permits the passage of the substrate between the chemical treatment module 410 and the thermal treatment module 420. In addition, the transfer module 430 can comprise two transfer openings, the first transfer opening permits the passage of the substrate between the chemical treatment module 410 and the transfer module 430, and the second transfer opening permits the passage of the substrate between the transfer module 430 and the multi-element manufacturing system 440.

The chemical treatment module 410 can comprise a temperature controlled substrate holder 412 configured to be substantially thermally isolated from the other components of the chemical treatment module 410 and can be configured to support a substrate 411. Element 414 can be used to couple and isolate the temperature controlled substrate holder 412. The chemical treatment module 410 can also comprise a vacuum pumping system 416 for controlling process pressures, and a gas distribution system 418 for providing one or more process gasses during processing and/or cleaning. For example, vacuum pumping system 416 may include a vacuum pump and a gate valve (not shown) for controlling the chamber pressure, and the process gas can comprise $NH_3$, HF, $H_2$, $O_2$, CO, $CO_2$, Ar, He, etc.

In addition, the substrate holder 412 can comprise an electrostatic clamping system (not shown) in order to electrically clamp substrate 411 to the substrate holder 412, a temperature control system (not shown) for controlling the substrate holder temperature, and a multi-zone backside gas system (not shown) to improve the gas-gap thermal conductance between substrate 411 and substrate holder 412. In other embodiments, heating/cooling elements, such as resistive heating elements, or thermoelectric heaters/coolers can be included in the substrate holder 412, as well as other components of the chemical treatment module 410. Alternatively, other clamping means may be used.

The thermal treatment module 420 can comprise a temperature controlled substrate holder 422 configured to be substantially thermally isolated from the other components of the thermal treatment module 420 and can be configured to support a substrate 421. Element 424 can be used to couple and isolate the temperature controlled substrate holder 422. The thermal treatment module 420 can also comprise a vacuum pumping system 426 for controlling process pressures, and a temperature controlled upper assembly 428 for controlling temperatures and providing one or more process gasses during processing and/or cleaning. For example, vacuum pumping system 426 may include a vacuum pump and a gate valve (not shown) for controlling the chamber pressure, and the process gas can comprise $N_2$, $NH_3$, HF, $H_2$, $O_2$, CO, $CO_2$, Ar, He, etc. Alternatively, other gasses may be used during vaporization of chemically treated surface layer.

In addition, the substrate holder 422 can comprise an electrostatic clamping system (not shown) in order to electrically clamp substrate 421 to the substrate holder 422, a temperature control system (not shown) for controlling the substrate holder temperature, and a multi-zone backside gas system (not shown) to improve the gas-gap thermal conductance between substrate 421 and substrate holder 422. In other embodiments, heating/cooling elements, such as resistive heating elements, or thermoelectric heaters/coolers can be included in the substrate holder 422, as well as other components of the thermal treatment module 420.

Substrates can be transferred between the chemical treatment module 410, the thermal treatment module 420, and the transfer module 430. During processing, the chemical treatment module 410, the thermal treatment module 420, and/or the transfer module 430 can be sealed using one or more of the gate valve assemblies (407, 417, and 427) in order to permit independent processing in the modules (410, 420, and 430). The chemical treatment module 410, the thermal treatment module 420, and the transfer module 430 can be temperature-controlled and can be thermally insulated from one another.

The COR subsystem 400 can further comprise a controller 450 having a microprocessor, memory, and a digital I/O ports configured to transmit signals to the chemical treatment module 410, the thermal treatment module 420, and/or the transfer module 430 as well as receive signals from the chemical treatment module 410, the thermal treatment module 420, and/or the transfer module 430.

When a COR procedure is performed, a substrate can be transferred to the chemical treatment module 410 from the transfer module 430. The substrate can be secured to the substrate holder 412 and a heat transfer gas can be supplied to the backside (center and edge) of the substrate. Next, a first COR recipe can be established for the COR procedure, and the first COR recipe can comprise a number of processing parameters that can include a chemical treatment processing pressure, a chemical treatment wall temperature, a chemical treatment substrate holder temperature, a chemical treatment substrate temperature, a chemical treatment gas distribution system temperature, or a chemical treatment gas flow rate, or any combination thereof. Then, the substrate can be chemically treated for a first time using the first COR recipe. The first time can range from 10 to 480 seconds, for example.

In addition, the substrate can be transferred from the chemical treatment module 410 to the thermal treatment module 420. The substrate can be secured to the substrate holder 422 and a heat transfer gas can be supplied to the backside (center and edge) of the substrate. Next, a second COR recipe can be established for the COR procedure, and the second COR recipe can comprise a number of processing parameters that can include a thermal treatment wall temperature, a thermal treatment upper assembly temperature, a thermal treatment substrate temperature, a thermal treatment substrate holder temperature, a thermal treatment substrate temperature, or a thermal treatment processing pressure, or any combination thereof. Then, the substrate can be thermally treated for a second time using the second COR recipe. The second time can range from 10 to 480 seconds, for example.

In an S-O example, the COR subsystem 400 can be used to remove or trim oxidized poly-Si material. Alternatively, the COR subsystem 400 may be used to remove or trim an oxide masking layer. The COR subsystem 400 can comprise a chemical treatment module 410 for chemically treating exposed surface layers, such as oxide surface layers, on a substrate, whereby adsorption of the process chemistry on the exposed surfaces affects chemical alteration of the surface layers. Additionally, the COR subsystem 400 can comprise thermal treatment module 420 for thermally treating the substrate, whereby the substrate temperature is elevated in order to desorb (or evaporate) the chemically altered exposed surface layers on the substrate.

The COR system can be used to perform a dry, non-plasma etching process that can include a chemical process during which exposed surfaces of the dielectric layer are chemically treated by a process gas comprising HF, or ammonia (NH3), or both HF and NH3, and a desorption process during which the chemically altered surface layers can be removed. The desorption can comprise a thermal treatment process within which the temperature of the substrate is raised sufficiently high to permit the volatilization of the chemically altered surface layers. Using the dry, non-plasma etching process, the chemically treated material can be substantially removed.

During the chemical treatment process, each constituent of the process gas may be introduced together (i.e., mixed), or separately from one another (i.e., HF introduced independently from NH3). Additionally, the process gas can further include an inert gas, such as a noble gas (i.e., argon). The inert gas may be introduced with either the HF or the NH3, or it may be introduced independently from each of the aforementioned gaseous constituents. Further details regarding the introduction of a noble gas with NH3 in order to control the extent to which surface layers of the dielectric film are chemically altered is described in pending U.S. patent application Ser. No. 10/812,347, entitled "Processing system and method for treating a substrate", the entire contents of which are herein incorporated by reference in their entirety.

Additionally, during the chemical treatment process, the process pressure may be selected to affect the extent to which surface layers of the dielectric film are chemically altered. The process pressure can range from approximately 1 mTorr to approximately 100 Torr. Additionally, the process pressure can range from about 1 to about 100 mTorr. Alternatively, the process pressure can range from about 2 to about 25 mTorr. Vacuum pumping system 416 and 426 can be configured to provide a uniform (three-dimensional) pressure field. The process gas flow rates can range from about 1 to about 5000 sccm for each specie. Alternatively, the flow rates can range from about 10 to about 500 sccm.

Furthermore, during the chemical treatment process, the substrate temperature may be selected to affect the extent to which surface layers of the dielectric film are chemically altered. The substrate temperature can range from approximately 10 degrees C. to approximately 200 degrees C. Further details regarding the setting of the substrate temperature in order to control the extent to which surface layers of the dielectric film are chemically altered is described in pending U.S. patent application Ser. No. 10/817,417, entitled "Method and system for performing a chemical oxide removal process", the entire contents of which are herein incorporated by reference in their entirety.

Additionally, the chemical treatment chamber 419 can be heated to a temperature ranging from about 10 degrees to about 200 degrees C. Alternatively, the chamber temperature can range from about 35 degrees to about 55 degrees C. Additionally, the gas distribution system 418 can be heated to a temperature ranging from about 10 degrees to about 200 degrees C. Alternatively, the gas distribution system temperature can range from about 40 degrees to about 80 degrees C. The substrate 411 can be maintained at a temperature ranging from about 10 degrees to about 50 degrees C. Alternatively, the substrate temperature can range form about 25 degrees to about 30 degrees C.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

In the thermal treatment system, the thermal treatment chamber 429 can be heated to a temperature ranging from about 20 degrees to about 200 degrees C. Alternatively, the chamber temperature can range from about 75 degrees to about 100 degrees C. Additionally, the upper assembly 428 can be heated to a temperature ranging from about 20 degrees to about 200 degrees C. Alternatively, the upper assembly temperature can range from about 75 degrees to about 100 degrees C. The substrate 421 can be heated to a temperature in excess of about 100 degrees C., for example, from about 100 degrees to about 200 degrees C. Alternatively, the substrate temperature can range from about 100 degrees to about 150 degrees C.

The COR subsystem 400 can produce an etch amount of an exposed oxide surface layer in excess of 10 nm per 60 seconds for oxidized poly-Si, an etch amount of the exposed oxide surface layer in excess of 25 nm per 180 seconds for thermal oxide, and an etch amount of the exposed oxide surface layer in excess of 10 nm per 180 seconds for ozone TEOS. The COR subsystem 400 can also produce an etch variation across a substrate of less than 2.5%.

When an S-O procedure is performed, one or more of the controllers (114, 124, 134, 144, and 190) can be used. In some examples, evaluation decisions for an S-O procedure can be made using the data from a first site, and the first site can be selected from the number of evaluation sites on the first S-O substrate. The first site can have a first evaluation feature associated therewith that was created using the S-O procedure. S-O evaluation data can be obtained from the first evaluation site on the first S-O substrate, and the first site can have first S-O measurement and/or inspection data associated therewith. For example, S-O measurement and/or inspection data can be obtained from one or more of the subsystems (110, 120, 130, 140, and 170). In addition, first S-O verification data can be established for the first site on the first S-O substrate, and the first S-O verification data can include verified S-O measurement and/or inspection data that can be obtained from an S-O evaluation library and/or database. Confidence data and/or risk data can be established for the first site using a first difference between the S-O evaluation data and the S-O verification data. The S-O procedure can be identified as a verified S-O procedure when a first verification limit is met, and the S-O procedure can be identified as an un-verified S-O procedure when a first verification limit is not met.

During some S-O procedure, when a site is used, the number of required sites can be decreased by one, and the number of visited sites can be increased by one, and the S-O procedure can have confidence data, risk data, and/or verification data associated therewith.

In other examples, when an S-O procedure is being evaluated and/or performed, sites on additional S-O substrates can be used. For example, evaluation decisions can be made using the data from sites on one or more S-O substrates. One or more of the controllers (114, 124, 134, 144, and 190) can also be configured for establishing an additional S-O evaluation procedure for an additional S-O substrate.

One or more of the subsystems (110, 120, 130, 140, 150, 160, and 170) can be configured for delaying one or more of the S-O substrates, and when delayed substrates are used, one or more of the controllers (114, 124, 134, 144, and 190) can also be configured to establish delayed process, confidence, and/or risk data and to use the delayed data to make additional process corrections and/or improvements.

In various embodiments, the one or more processing elements (113, 123, 133, and 133) can include one or more lithography-related processing elements, one or more scanner-related processing elements, one or more inspection-related processing elements, one or more measurement-related elements, one or more evaluation-related elements, one or more etch-related processing elements, one or more deposition-related processing elements, one or more thermal processing elements, one or more coating-related processing elements, one or more alignment-related processing elements, one or more polishing-related processing elements, one or more storage-related elements, one or more transfer elements, one or more cleaning-related processing elements, one or more rework-related processing elements, one or more oxidation-related processing elements, one or more nitridation-related processing elements, or one or more external processing elements, or any combination thereof.

An S-O sequence can be performed in real-time and can include one or more lithography-related procedures, one or more scanner-related procedures, one or more inspection-related procedures, one or more measurement-related procedures, one or more evaluation-related procedures, one or more etch-related procedures, one or more COR procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

In some embodiments, the data used to evaluate/verify an S-O procedure and/or structure can include intensity data, transmission data, absorption data, reflectance data, diffraction data, optical properties data, or image data, or any combination thereof. The verification data can include historical data, real-time data, optical metrology data, imaging data, particle data, CD-scanning electron microscope (CD-SEM) data, transmission electron microscope (TEM) data, and/or focused ion beam (FIB) data. The threshold limit data can include goodness of fit data, CD data, accuracy data, wavelength data, sidewall data, particle data, process data, historical data, or a combination thereof.

In some S-O examples, a first set of evaluation verification features can be created by developing an exposed masking layer, a second set of verification features can be created by etching one or more layers, and a third set of verification features can be created by using a COR procedure. In other examples, the second set of verification features can be created after the COR procedure. Confidence and/or risk data can be determined for the development procedure, the etching procedure, and the COR procedure.

The substrates can include one or more layers that can include semiconductor material, carbon material, dielectric material, glass material, ceramic material, metallic material, oxidized material, mask material, or planarization material, or a combination thereof.

When a product is being developed, one or more S-O libraries can be created, refined, updated, and/or used, and the S-O libraries can include features, properties, structures, procedures, images, and/or optical data. The processing system 100 can use S-O procedures and/or S-O evaluation procedures to create data for one or more evaluation libraries.

When an S-O evaluation library is created, refined, and/or verified, one or more structures on a reference "golden" substrate can be used, and one or more of the controllers (114, 124, 134, 144, and 190) can be configured to perform the following steps: a) selecting a structure from a number of reference structures on the reference substrate, where the reference structure was created using a verified S-O procedure; b) obtaining S-O verification data from the reference structure, where the S-O verification data includes S-O measurement and/or inspection data from a reference structure produced using a verified S-O procedure; c) establishing simulation data for the reference structure, where the simulation data comprises simulated measurement and/or inspection data for the reference structure produced using the verified S-O procedure; d) establishing confidence data and/or risk data for the reference structure on the reference substrate using one or more differences calculated using the S-O verification data and the simulation data; e) identifying the reference structure on the reference substrate as a verified structure, decreasing the number of required reference structures by one, increasing the number of examined reference structures by one, and storing data associated with the reference structure as verified data in the S-O evaluation library, when an S-O library creation limit is met; f) identifying the reference structure on the reference substrate as an unverified structure, decreasing the number of required reference structures by one, and increasing the number of examined reference structures by one, when the S-O library creation limit is not met; g) repeating steps a)-f) when the number of required reference structures is greater than zero; and j) stopping the S-O library creation process when the number of required reference structures is equal to zero.

In other embodiments, one or more substrates can be processed using a verified S-O procedure. When a verified S-O procedure is performed, one or more S-O-related reference structures can be created on a reference substrate ("golden wafer"). When a reference substrate is examined, a test reference structure can be selected from a number of S-O-related reference structures on the reference substrate, and the test reference structure was created using the verified S-O procedure. During the examination, S-O-related examination data can be obtained from the test reference structure, and the gate-optimization-related examination data can include S-O-related measurement and/or inspection data from the test reference structure produced using the verified S-O procedure. A best estimate structure and associated best estimate data can be selected from an S-O library that includes spacer structures and associated data. For example, the data may include diffraction signals and/or spectra, refraction signals and/or spectra, reflection signals and/or spectra, or transmission signals and/or spectra, or any combination thereof. One or more differences can be calculated between the test reference structure and the best estimate structure from the library, the differences can be compared to matching criteria, creation criteria, or product requirements, or any combination thereof. For example, differences can be calculated between the intensity signals, transmission signals, reflected signals, diffraction signals, or diffraction spectra, or any combination thereof. When matching criteria are used, the test reference structure can be identified as a member of the S-O evaluation library, and the current substrate can be identified as a reference substrate if the matching criteria are met. When creation criteria are used, the test reference structure can be identified as a new member of the S-O evaluation library, and the current substrate can be identified as a verified reference substrate if the creation criteria are met. When product requirement data is used, the test reference structure can be identified as a verified structure, and the substrate can be identified as verified production substrate if one or more product requirements are met. Corrective actions can be applied if one or more of the criteria or product requirements are not met. S-O-related confidence data and/or risk data can be established for the test reference structure using the test reference structure data and the best estimate structure data.

The verified S-O procedures can include one or more deposition procedures, one or more partial-etch procedures, one or more COR-etch procedures, and one or more evaluation procedures, or one or more verification procedures, or any combination thereof. Alternatively, verified S-O procedure may include transfer procedures and/or storage procedures.

When S-O-related reference structures are produced and/or examined, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some examples, corrective actions can include stopping the processing, pausing the processing, re-evaluating one or more of the S-O substrates, re-measuring one or more of the S-O substrates, re-inspecting one or more of the S-O substrates, re-working one or more of the S-O substrates, storing one or more of the S-O substrates, cleaning one or more of the S-O substrates, delaying one or more of the S-O substrates, or stripping one or more of the S-O substrates, or any combination thereof.

In some embodiments, the S-O evaluation library data can include goodness of fit (GOF) data, creation rules data, measurement data, inspection data, verification data, map data, confidence data, accuracy data, process data, or uniformity data, or any combination thereof.

Figure 5:
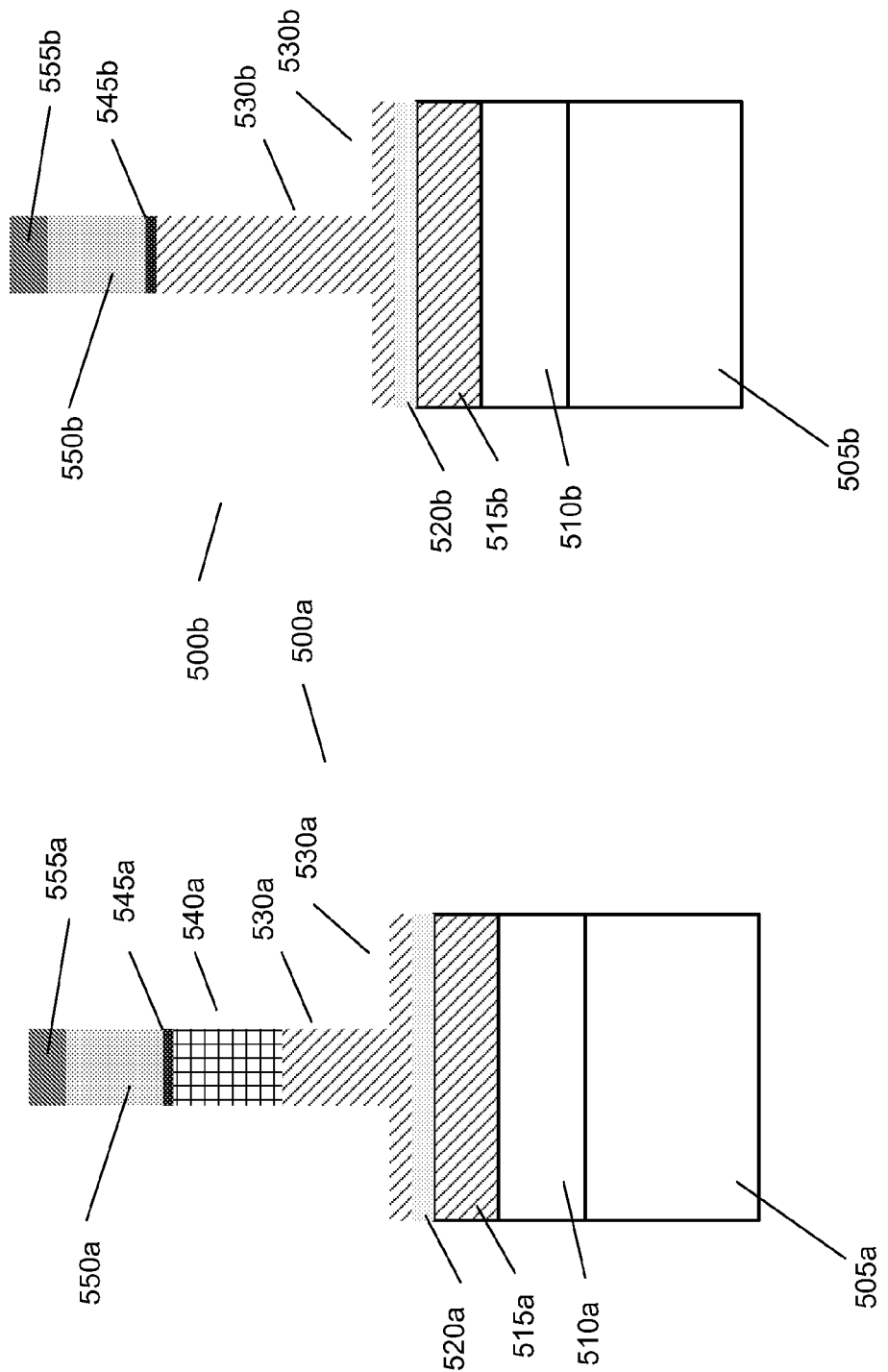
FIG. 5 illustrates an exemplary view of an Negative Channel Field Effect Transistor (nFET) structure and Positive Channel Field Effect Transistor (pFET) structure in accordance with embodiments of the invention.

FIG. 5 illustrates an exemplary view of a Negative Channel Field Effect Transistor (nFET) structure and Positive Channel Field Effect Transistor (pFET) structure in accordance with embodiments of the invention.

FIG. 5 shows an exemplary gate stack for an nFET structure 500a and an exemplary gate stack for a pFET structure 500b. The exemplary gate stack for the nFET structure 500a can include a bulk silicon layer 505a, a buried oxide layer 510a, a silicon-on-insulator (SOI) layer 515a, a gate oxide layer 520a, an un-doped poly-Si layer 530a, a doped poly-SI layer 540a, a nitride cap layer 545a, an oxide layer 550a, and a bottom antireflective coating (BARC) layer 555a. Alternatively, the number of layers may be different and other materials may be used. The exemplary gate stack for the pFET structure 500b can include a bulk silicon layer 505b, a buried oxide layer 510b, a silicon-on-insulator (SOI) layer 515b, a gate oxide layer 520b, an un-doped poly-Si layer 530b, a nitride cap layer 545b, an oxide layer 550b, and a bottom antireflective coating (BARC) layer 555b. Alternatively, the number of layers may be different and other materials may be used. In some embodiments, pre-processing data can be established for an S-O procedure, and the exemplary gate stack can be measured before an S-O sequence is performed. In other embodiments, pre-processing data can be established for an S-O procedure using one or more patterned masking layers, and the one or more patterned masking layers can be measured before a gate stack is produced.

Figure 6:
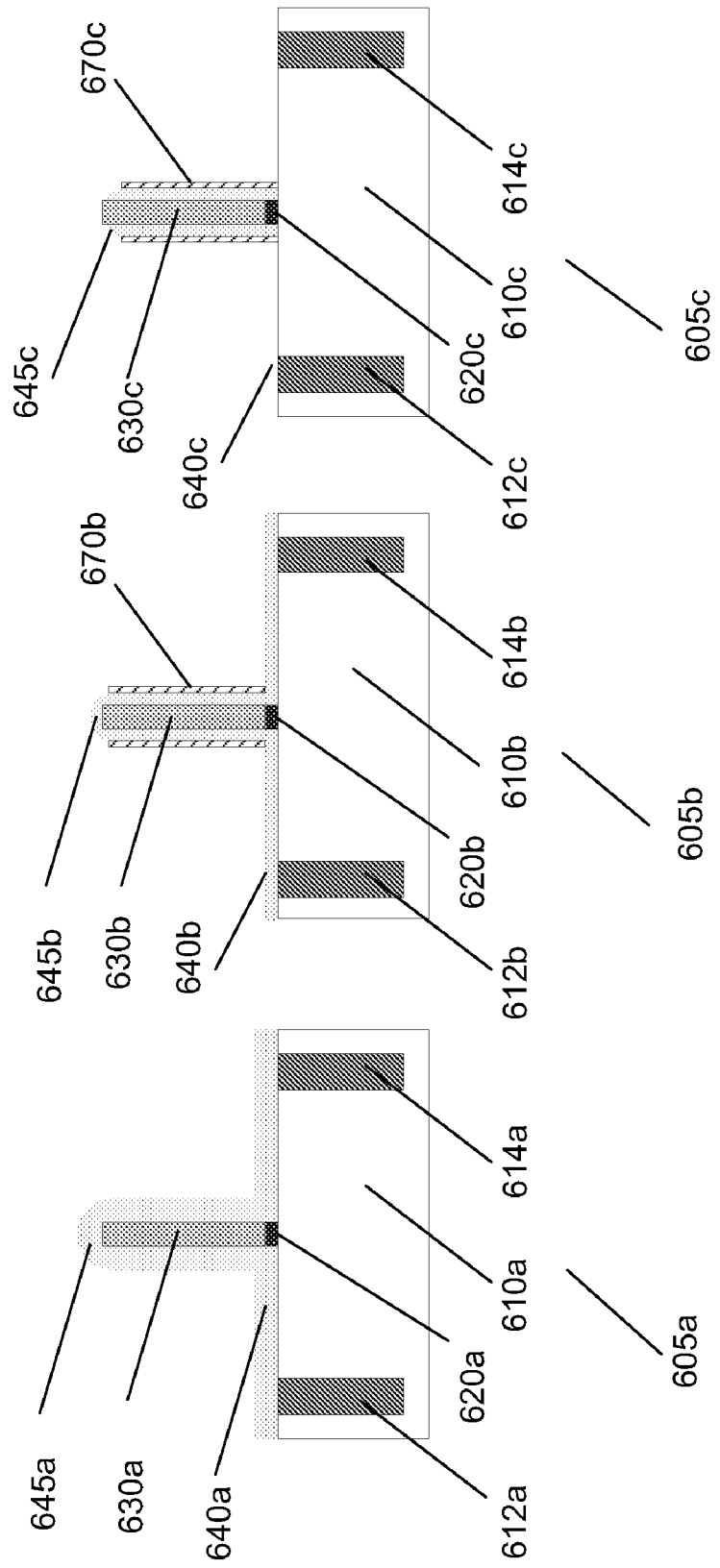
FIG. 6 illustrates a pictorial representation of process steps in accordance with embodiments of the invention.

FIG. 6 illustrates a pictorial representation of exemplary process steps in accordance with embodiments of the invention. In the illustrated embodiment, three pictorial representations are shown for three exemplary processing states (605a, 605b, and 605c) in an S-O sequence. The first exemplary processing state 605a illustrates a pictorial view of a gate structure after one or more spacer deposition processes have been performed. The second exemplary processing state 605b illustrates a pictorial view of a gate structure after one or more partial-etch processes have been performed. The third exemplary processing state 605b illustrates a pictorial view of a gate structure after one or more COR-etch processes have been performed. Alternatively, other different processes may be used and/or different sequences may be used.

The first exemplary processing state 605a illustrates a pictorial view of a gate structure 630a, a gate oxide layer 620a, and a vertical spacer layer 645a. In addition, a substrate layer 610a portion is shown having a source area 612a and a drain area 614a, and a horizontal spacer layer 640a is shown on the substrate layer 610a. The width of the gate structure 630a can vary between approximately 25 nm and 60 nm, the width of the gate oxide layer 620a can vary between approximately 25 nm and 60 nm, and the thickness of the vertical spacer layer 645a can vary between approximately 1 nm and 10 nm. The height of the gate structure 630a can vary between approximately 125 nm and 160 nm, the height of the gate oxide layer 620a can vary between approximately 1 nm and 10 nm, and the thickness of the horizontal spacer layer 640a can vary between approximately 2 nm and 10 nm.

The second exemplary processing state 605b illustrates a pictorial view of a gate structure 630b, a gate oxide layer 620b, a reduced vertical spacer layer 645b, and a deposited protection layer 670b. In addition, a substrate layer 610b portion is shown having a source area 612b and a drain area 614b, and a reduced horizontal spacer layer 640b is shown on the substrate layer 610b. The width of the gate structure 630b can vary between approximately 25 nm and 60 nm, the width of the gate oxide layer 620b can vary between approximately 25 nm and 60 nm, the thickness of the reduced vertical spacer layer 645b can vary between approximately 1 nm and 10 nm, and the thickness of the deposited protection layer 670b can vary between approximately 1 nm and 10 nm. The height of the gate structure 630b can vary between approximately 125 nm and 160 nm, the height of the deposited protection layer 670b can vary between approximately 125 nm and 160 nm, the height of the gate oxide layer 620b can vary between approximately 1 nm and 10 nm, and the thickness of the reduced horizontal spacer layer 640b can vary between approximately 1 nm and 8 nm. For example, the height of the spacer layer 645b can be less than the height of the spacer layer 645a.

The third exemplary processing state 605c illustrates a pictorial view of a gate structure 630c, a gate oxide layer 620c, a reduced vertical spacer layer 645c, and a modified protection layer 670c. In addition, a substrate layer 610c portion is shown having a source area 612c and a drain area 614c, and spacer material has been removed and in not shown on the substrate layer 610c. The width of the gate structure 630c can vary between approximately 25 nm and 60 nm, the width of the gate oxide layer 620c can vary between approximately 25 nm and 60 nm, the thickness of the reduced vertical spacer layer 645c can vary between approximately 1 nm and 10 nm, and the thickness of the modified protection layer 670c can vary between approximately 1 nm and 10 nm. The height of the gate structure 630c can vary between approximately 125 nm and 160 nm, the height of the modified protection layer 670c can vary between approximately 120 nm and 155 nm, and the height of the gate oxide layer 620c can vary between approximately 1 nm and 10 nm. For example, the height of the spacer layer 645c can be less than the height of the spacer layer 645b, the width of the spacer layer 645c can be substantially the same as the width of the spacer layer 645b, and the thickness of the substrate layer 610c can be substantially the same as the thickness of the substrate layer 610b. In addition, the substrate layer 610c, the source area 612c, and the drain area 614c have not been damaged by the processing steps shown in FIG. 6.

Figure 7:
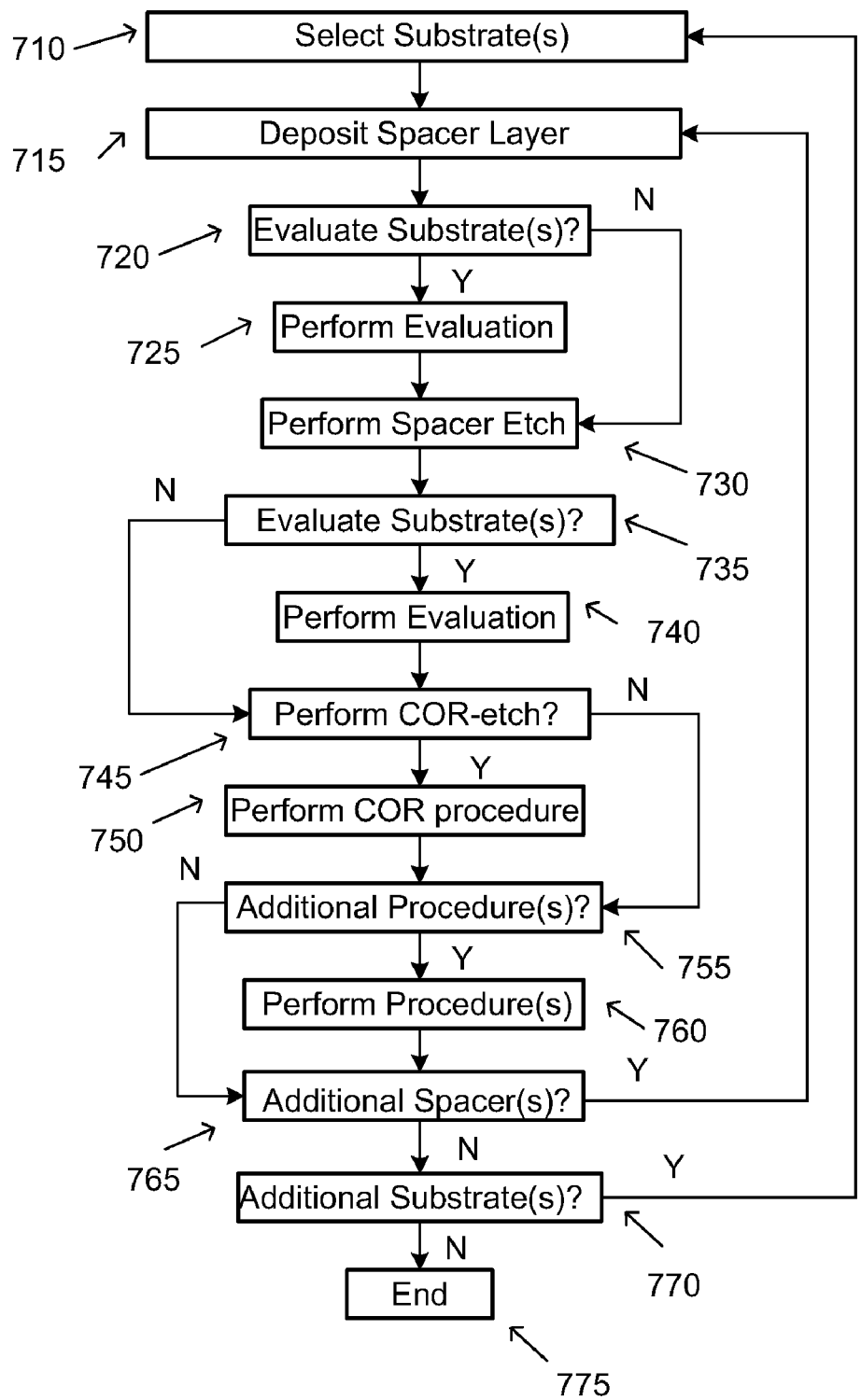
FIG. 7 illustrates an exemplary flow diagram of method for processing substrates using procedures in accordance with embodiments of the invention.

FIG. 7 illustrates an exemplary flow diagram of another method for processing substrates using procedures in accordance with embodiments of the invention. The substrates can include one or more layers that can include semiconductor material, carbon material, dielectric material, glass material, ceramic material, metallic material, oxidized material, doped material, implanted material, mask material, or planarization material, or a combination thereof.

In some cases, S-O procedures can be developed during the early states of the production cycle and can be used throughout the production cycle. In some example, procedures may be used to account for processing differences between Negative Channel Field Effect Transistor (nFET) structures and Positive Channel Field Effect Transistor (pFET) structures, to locate test structures, to improve line width roughness and/or line edge roughness, and to improve overlay problems.

In 705, one or more substrates can be received by one or more subsystems (110, 120, 130, 140, and 170) in a processing system (100). In some embodiments, one or more of the substrates can be received by one or more transfer subsystems (150, 160) coupled to one or more of the subsystems (110, 120, 130, 140, and 170). Alternatively, one or more of the substrates can be received by a different subsystem. In addition, a system controller 190 can be used to receive the substrate data for the one or more substrates. Alternatively, some of the substrate data may be received by a different controller. In other cases, a MES 180 system can exchange data with the system controller 190 and one or more of the subsystems (110, 120, 130, 140, and 170), and the data can be used to determine and/or control the S-O procedure.

In 710, one or more substrates can be selected, and one or more of the selected substrates can have a processing sequence associated with it. In some cases, each substrate can have a different processing sequence, or in other cases, several substrates can have the same processing sequence associated with them.

In 715, one or more spacer layers can be deposited on one or more of the substrates. For example, the deposition subsystem 130 can be used to deposit the one or more spacer layers, and the evaluation subsystem 140 can be used to evaluate the one or more spacer layers. Alternatively, the deposition and/or the evaluation procedures may be performed externally.

In 720, a query can be performed to determine when a first evaluation procedure is required for the current substrate. When a first evaluation procedure is required for the current substrate, procedure 700 can branch to 725, and when a first evaluation procedure is not required for the current substrate, procedure 700 can branch to 730. Alternatively, a first evaluation procedure may not be required for any of the substrates.

In 725, a first evaluation procedure can be performed, and first evaluation data can be obtained using one or more sites on the substrate. In addition, first measurement and/or first inspection data can be obtained using a first measurement procedure and/or a first inspection procedure. For example, the first evaluation data can include first substrate data, first gate structure data, and/or first spacer layer data.

In 730, a spacer etch procedure can be performed. For example, a first spacer etch procedure can be performed in an SCCM Poly chamber and the processing conditions can include a chamber pressure of approximately 15-25 mTorr, a top electrode RF power level of approximately 475-525 watts, a bottom electrode RF power level of approximately 90-110 watts, a flow rate for a first process gas ($C_4F_8$) of approximately 10-30 sccm, a flow rate for a second process gas (Ar) of approximately 700-900 sccm, a backside pressure of approximately 8-12 Torr proximate the center of the substrate, a backside pressure of approximately 20-30 Torr proximate the edge of the substrate, and a substrate holder temperature of approximately 25-35 degrees C. The endpoint time for a complete etch can vary from approximately 28 seconds to 31 seconds and the partial-etch time can be between approximately 75% and 85% of the endpoint time for the complete etch. In one example, when the end point time was approximately 29.5 seconds, the partial-etch time used was approximately 22.8 seconds. Alternatively, other times can be used.

In 735, a query can be performed to determine when a second evaluation procedure is required for the current substrate. When a second evaluation procedure is required for the current substrate, procedure 700 can branch to 740, and when a second evaluation procedure is not required for the current substrate, procedure 700 can branch to 745. Alternatively, a second evaluation procedure may not be required for any of the substrates.

In 740, a second evaluation procedure can be performed, and second evaluation data can be obtained using one or more sites on the substrate. In addition, second measurement and/or second inspection data can be obtained using a second measurement procedure and/or a second inspection procedure. For example, the second evaluation data can include second substrate data, second gate structure data, and/or second spacer layer data, and the second evaluation data can be obtained using iODP techniques.

In 750, a COR procedure can be performed. Alternatively, another trimming procedure may be performed. When the COR procedure is performed, a chemical treatment procedure can be performed in which the surfaces on a substrate can be chemically treated using a first process gas, and a solid reaction product can be formed on at least one exposed surface of the substrate. The first process gas can include Ar, HF and $NH_3$, and the Ar flow rate can be between approximately 15 sccm and approximately 35 sccm, the HF flow rate can be between approximately 40 sccm and approximately 60 sccm, and the $NH_3$ flow rate can be between approximately 15 sccm and approximately 35 sccm. The COR chamber top wall temperature can range from approximately 30 degrees Celsius to approximately 70 degrees Celsius, the COR chamber side wall temperature can range from approximately 30 degrees Celsius to approximately 70 degrees Celsius, and a substrate holder temperature can range from approximately 40 degrees Celsius to approximately 60 degrees Celsius. The COR chamber pressure can range from approximately 5 mTorr to approximately 15 mTorr, and a COR process time can range from approximately 100 seconds to approximately 140 seconds.

In addition, a post heat treatment (PHT) procedure can be performed, the solid reaction product can be evaporated, and the chemically treated exposed surface layers can be removed. During the PHT procedure, a second process gas that includes $N_2$ can be used, and $N_2$ flow rates can vary between approximately 800 sccm and approximately 1000 sccm. The PHT chamber top wall temperature can range from approximately 70 degrees Celsius to approximately 90 degrees Celsius, the PHT chamber side wall temperature can range from approximately 70 degrees Celsius to approximately 90 degrees Celsius, and the PHT substrate holder temperature can range from approximately 120 degrees Celsius to approximately 180 degrees Celsius. In addition, the PHT chamber pressure can range from approximately 650 mTorr to approximately 700 mTorr, and a PHT process time can range from approximately 100 seconds to approximately 140 seconds.

In 755, a query can be performed to determine when a third evaluation procedure is required for the current substrate. When a third evaluation procedure is required for the current substrate, procedure 700 can branch to 760, and when a third evaluation procedure is not required for the current substrate, procedure 700 can branch to 765. Alternatively, a third evaluation procedure may not be required for any of the substrates.

In 760, a third evaluation procedure can be performed, and third evaluation data can be obtained using one or more sites on the substrate. In addition, third measurement and/or third inspection data can be obtained using a third measurement procedure and/or a third inspection procedure. For example, the third evaluation data can include third substrate data, third gate structure data, and/or third spacer layer data, and the third evaluation data can be obtained using iODP techniques.

In 765, a query can be performed to determine when one or more additional procedures are required. When an additional procedure is required, procedure 700 can branch to 770, and when an additional procedure is not required, procedure 700 can branch to 775.

In 770, one or more additional procedures can be performed. The additional procedures can be performed using one or more of the subsystems (110, 120, 130, 140, and 170). Alternatively, other subsystems (not shown) may be used. The additional procedures can include implanting procedures, doping procedures, thermal procedures, masking procedures, and/or measurement procedures.

In 775, a query can be performed to determine when a new spacer is required. When a new spacer is required, procedure 700 can branch to 715, and when a new spacer is not required, procedure 700 can branch to 780.

In 780, a query can be performed to determine when additional substrates require processing. When additional substrates require processing, procedure 700 can branch to 710, and when additional substrates are not available, procedure 700 can branch to 790. Procedure 700 can end in 790.

In addition, spacer-related data can include gate data, drain data, source data, capacitor data, via data, trench date, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

The S-O processing sequences can include one or more mask creation procedures, one or more deposition procedures, one or more coating procedures, one or more etching procedures, one or more thermal procedures, one or more implanting procedures, one or more doping procedures, one or more exposure procedures, one or more oxidation procedures, one or more nitridation procedures, one or more ionization procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more modeling procedures, or one or more cleaning procedures, or any combination thereof.

When multiple sites and/or substrates are evaluated, confidence and/or risk data can be established for individual substrates and/or groups of substrates.

When a first (most accurate) threshold limit is met, the item being evaluated can be identified as having the highest level of confidence and/or the lowest risk factor associated therewith. When another (less accurate) threshold limit is met, the item being evaluated can be identified as having a lower level of confidence and/or a higher risk factor associated therewith. When one or more (varying in accuracy) threshold limits are not met, the item being evaluated can be identified as an unverified item having a low level of confidence and/or a high risk factor associated therewith.

In some embodiments, a first set of substrates can be processed by one or more deposition subsystems 130 in the processing system 100, and one or more spacer layers can be created on one or more of the first set of substrates using one or more deposition procedures. Alternatively, one or more of the deposition can be performed using one or more of the subsystems (110, 120, 130, and 140) in the processing system 100. Next, first confidence data and/or first risk data can be established for the first set of deposition substrates using a first evaluation procedure, and a first set of high confidence substrates can be established using data from the first evaluation procedure. One or more of the substrates processed by one or more deposition subsystems 130 in the processing system 100 can be transferred to the evaluation subsystem 140, and the one or more spacer layers created on one or more of the first set of substrates using the one or more deposition procedures can be evaluated. One or more of the substrates can be transferred to the etching subsystem 110, and one or more partially-etched spacer layers can be created on the one or more substrates. For example, a first set of partially-etched substrates can be created by performing one or more partial-etch procedures using the first set of high confidence substrates. Alternatively, the one or more etching procedures may be performed using one or more of the subsystems (110, 120, 130, 140, and 170) in a processing system 100. In addition, second confidence data and/or second risk data can be established for the first set of partially-etched substrates using a second evaluation procedure, and a second set of high confidence substrates can be established using the data from the first and/or second evaluation procedures. The second set of high confidence substrates can be stored and/or sent for further processing. When a second set of low confidence substrates is established, these substrates can be transferred to a COR subsystem 120 where a COR-etch procedure can be performed. The COR-etch procedure can be different for each substrate, and a first set of COR-etched substrates can be transferred to one or more of the evaluation subsystems 140. Third confidence data and/or third risk data can be established for the first set of COR-etched substrates using a third evaluation procedure, and a third set of high confidence substrates can be established using the data from the first, second, and/or third evaluation procedures. The third set of high confidence substrates can be stored and/or sent for further processing.

When new and/or additional measurement data, inspection data, and/or evaluation data is required, additional S-O data can be obtained from one or more sites on the substrate. For example, measurement features, such as periodic gratings, periodic arrays, and/or other periodic structures, on a substrate can be measured at one or more of the sites shown in FIG. 6.

The S-O measurement, inspection, and/or evaluation procedures can be time consuming and can affect the throughput of a processing system. During process runs, a manufacturer may wish to minimize the amount of time used to measure, inspect, verify, and/or evaluate a substrate. The S-O procedures can be time-dependent, and different S-O procedures may be selected based on their execution time. A smaller number of sites may be used when execution times are too long.

In some embodiments, the historical and/or real-time data can include S-O maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In addition, some S-O procedures may use substrate maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When substrate maps are created and/or modified, values may not be calculated and/or required for the entire substrate, and a substrate map may include data for one or more sites, one or more chip/dies, one or more different areas, and/or one or more differently shaped areas. For example, a processing chamber may have unique characteristics that may affect the quality of the processing results in certain areas of the substrate. In addition, a manufacturer may allow less accurate process and/or evaluation data for chips/dies in one or more regions of the substrate to maximize yield. When a value in a map is close to a limit, the confidence value may be lower than when the value in a map is not close to a limit. In addition, the accuracy values can be weighted for different chips/dies and/or different areas of the substrate. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a substrate. For example, values from another map may be used as weighting factors.

Corrective actions can include calculating new and/or update maps for the S-O substrates. In addition, corrective actions can include increasing the number of required evaluation sites by one or more when one or more values in the S-O map are not within a limit; and decreasing the number of required evaluation sites by one or more when one or more values in the first S-O map are within the limit.

Some errors that are generated by S-O procedures can be sent to the FDC system, and the FDC system can decide how the processing system should respond to the error. Other errors can be resolved by the S-O procedures.

In some embodiments, an S-O sequence can include 1) a first transfer procedure for transferring a first set of substrates to a deposition subsystem 130; 2) a first processing procedure for creating a spacer layer using the deposition subsystem 130; 3) a second transfer procedure for transferring a second set of substrates from the deposition subsystem 130 to one or more evaluation subsystems 140; 4) a first evaluation procedure for evaluating the spacer layer using a third set of substrates; 5) a third transfer procedure for transferring a fourth set of substrates from the one or more evaluation subsystems 140 to one or more etching subsystems 110; 6) a second processing procedure for creating a partially-etched spacer layer having a protection layer thereon using one or more etching subsystems 110; 7) a fourth transfer procedure for transferring a fifth set of substrates from the one or more etching subsystem 110 to one or more evaluation subsystems 140; 8) a second evaluation procedure for evaluating the partially-etched spacer layer and/or the protection layer thereon using a sixth set of substrates; 9) a fifth transfer procedure for transferring a seventh set of substrates from the one or more evaluation subsystems 140 to one or more COR subsystems 120; 10) a third processing procedure for trimming the partially-etched spacer layer having a protection layer thereon using the COR subsystem; 11) a sixth transfer procedure for transferring a eighth set of substrates from the one or more COR subsystems 120 to one or more evaluation subsystems 140; 12) a third evaluation procedure for evaluating the spacer layer using a ninth set of substrates; and 13) a seventh transfer procedure for transferring a tenth set of substrates from the one or more evaluation subsystems 140 to one or more storage locations. Alternatively, one or more of the steps (1-13) may not be required. When the first, second, and third evaluation procedures are performed, a minimum number of substrates can be evaluated to increase throughput.

The S-O evaluation features can include partially-etched structures, protected structures, etched structures, trimmed structures, doped structures, filled structures, semi-filled structures, damaged structures, capacitor structures, gate structures, gate electrode structures, gate stack structures, transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or any combination thereof.

In other embodiments, sets of high confidence substrates can be established by: 1a) obtaining mapping data from one or more spacer creation evaluation sites during the first spacer creation procedures; 2a) comparing the mapping data for each substrate in a first set of substrates to one or more requirements established for the one or more spacer creation evaluation sites; and 3a) identifying a substrate in the first set of substrates as a member of a first set of high confidence substrates if a first requirement is met. A second set of high confidence substrates can be established by: 1b) obtaining mapping data from one or more etch-dependent sites during a partial-etch procedure; 2b) comparing the mapping data for each substrate in the first set of high confidence substrates to one or more partial-etch requirements established for the one or more partial-etch-dependent sites; and 3b) identifying a substrate in the first set of high confidence substrates as a member of the second set of high confidence substrates if a first partial-etch requirement is met. A third set of high confidence substrates can be established by: 1c) obtaining mapping data from one or more COR-dependent sites during a COR-etch procedure; 2c) comparing the mapping data for each substrate in the second set of high confidence substrates to one or more COR-etch requirements established for the one or more COR-dependent sites; and 3c) identifying a substrate in the second set of high confidence substrates as a member of the third set of high confidence substrates if a first COR-etch requirement is met.

The S-O evaluation sites can include process-dependent sites, measurement-dependent sites, inspection-dependent sites, gate-dependent sites, substrate-dependent sites, or product dependent sites, or any combination thereof. The limit data can include confidence limits, risk limits, spacer creation limits, gate structure limits, partial-etch limits, COR-etch limits, accuracy limits, time limits, product requirement limits, measurement limits, inspection limits, simulation limits, prediction limits, or historical limits, or any combination thereof.

In some examples, first confidence and/or risk data can be established for an S-O substrate before, during, and/or after the spacer creation procedures are performed by a deposition subsystem 130, second confidence and/or risk data can be established for the S-O substrate before, during, and/or after the spacer evaluation procedures are performed by an evaluation subsystem 140, third confidence and/or risk data can be established for the S-O substrate before, during, and/or after one or more partial-etch procedures are performed by an etching subsystem 110, fourth confidence and/or risk data can be established for the S-O substrate before, during, and/or after evaluation procedures are performed using one or more partially-etched substrates by an evaluation subsystem 140, fifth confidence and/or risk data can be established for the S-O substrate before, during, and/or after one or more COR-etch procedures are performed by an COR subsystem 120, and sixth confidence and/or risk data can be established for the S-O substrate before, during, and/or after one or more COR-dependent evaluation procedures are performed by an evaluation subsystem 140.

In some examples, individual and/or total confidence values for the S-O substrate can be compared to individual and/or total confidence limits. The processing of a set of S-O substrates can continue, if one or more of the confidence limits are met, or corrective actions can be applied if one or more of the confidence limits are not met. Corrective actions can include establishing confidence values for one or more additional substrates in the set of S-O substrates, comparing the confidence values for one or more of the additional substrates to additional confidence limits; and either continuing to process the set of S-O substrates, if one or more of the additional confidence limits are met, or stopping the processing, if one or more of the additional confidence limits are not met.

In other examples, individual and/or total risk values for the S-O substrate can be compared to individual and/or total risk limits. The processing of a set of S-O substrates can continue, if one or more of the risk limits are met, or corrective actions can be applied if one or more of the risk limits are not met. Corrective actions can include establishing risk values for one or more additional substrates in the set of S-O substrates, comparing the risk values for one or more of the additional substrates to additional risk limits; and either continuing to process the set of S-O substrates, if one or more of the additional risk limits are met, or stopping the processing, if one or more of the additional risk limits are not met.

In addition, when the one or more partial-etch procedures have not produced high quality spacer structures and protection layers, one or more of the substrates can be transferred to other subsystems for post-processing, and when the one or more partial-etch procedures have produced high quality spacer structures and protection layers, one or more of the substrates can be transferred to one or more COR subsystems 120 for additional processing. One or more of the partially-etched substrates can be transferred from one or more of the etching subsystems 110 or from one or more of the evaluation subsystems 140 to the COR subsystem 120 using the first transfer subsystem 150. The one or more partially-etched substrates can be received by one or more storage/transfer elements 122 in the COR subsystem 120, can be transferred to one or more processing elements 123 in the COR subsystem 120, can be COR-etched using one or more COR procedures, and can be transferred to one or more storage/transfer elements 142 in the evaluation subsystem 140. One or more of the COR-etched substrates can be transferred from the COR subsystem 120 to one or more evaluation subsystems 140 using the first transfer subsystem 150. One or more of the COR-etched substrates can be received by one or more storage/transfer elements 142 in an evaluation subsystem 140, can be transferred to one or more evaluation elements 143 in the evaluation subsystem 140, can be evaluated using one or more COR-related evaluation procedures, and can be transferred to one or more storage/transfer elements 142 in the evaluation subsystem 140.

In addition, when the one or more COR procedures have produced high quality spacer structures, one or more of the substrates can be transferred to other subsystems for post-processing, and when the one or more COR procedures have not produced high quality spacer structures, the S-O procedure can be stopped and further evaluation can be performed.

Figure 8:
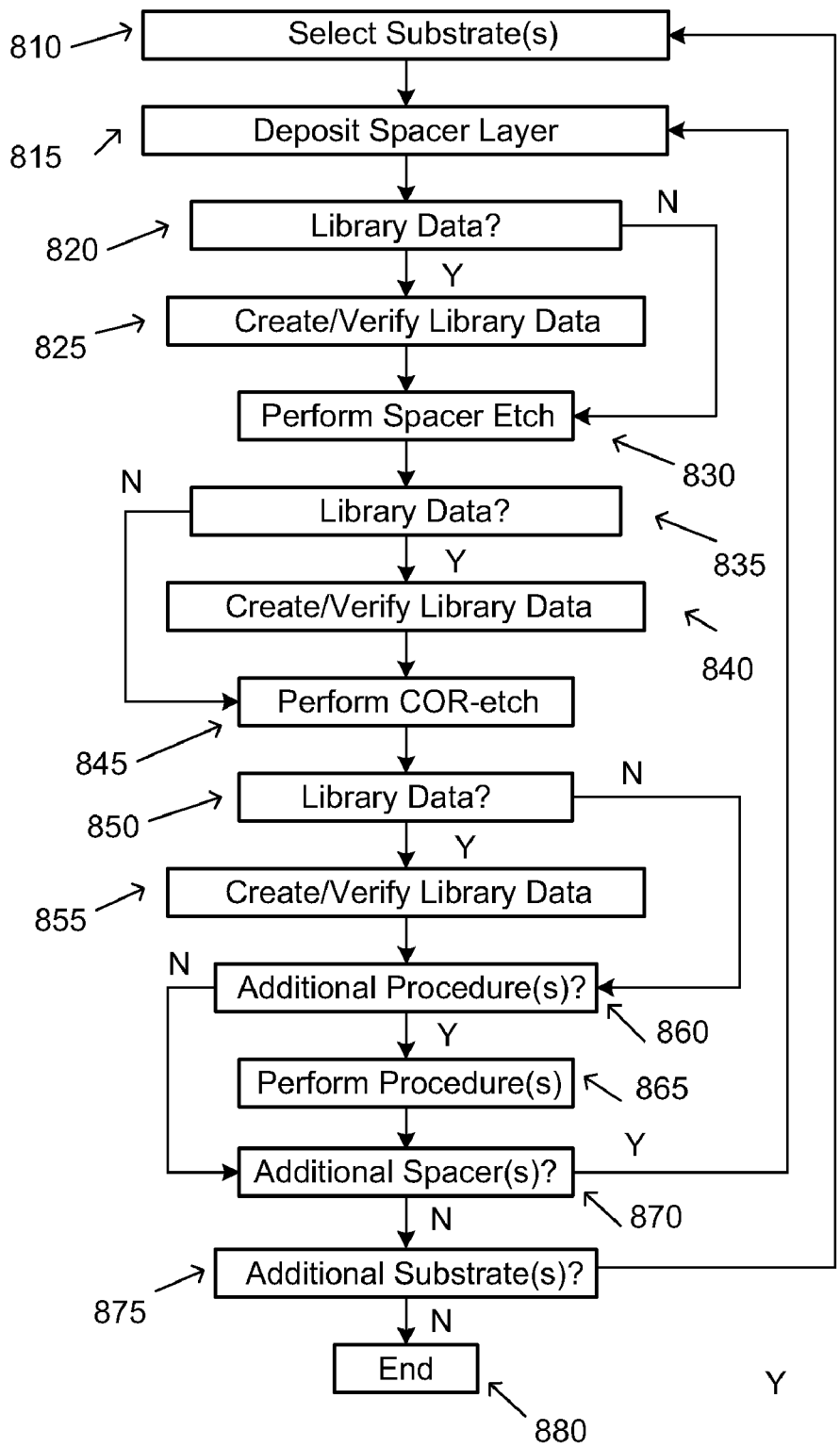
FIG. 8 illustrates an exemplary flow diagram of a method for creating an evaluation library for a Spacer-Optimization (S-O) procedure in accordance with embodiments of the invention.

FIG. 8 illustrates an exemplary flow diagram of a method for creating library-related data using one or more S-O procedures in accordance with embodiments of the invention. In some embodiments, a library-creation sequence can be established for creating and/or refining S-O data in a library, and one or more library-verification sequences can be established for using a library of S-O data to verify S-O processes and/or S-O substrates. For example, the library-related sequences can include one or more transfer procedures, one or more deposition procedures, one or more partial-etch procedures, one or more COR-etch procedures, or one or more evaluation procedures, or any combination thereof.

Library creation and/or verification decisions for one or more sets of substrates can be made in real time using measurement, evaluation, inspection, verification, predicted, historical and/or real-time data from one or more substrates. For example, data can be obtained from periodic evaluation features using iODP techniques, and periodic pattern of spacers and/or gate structures may be used. In addition, thicknesses and uniformity can be measured using one or more pads. Alternatively, measurements may be made using other techniques.

During an S-O procedure, confidence and/or risk data can be determined using measured data, evaluation data, inspection data, predicted data, and simulated data, and confidence and/or risk data can be determined for the measured data, the evaluation data, the inspection data, the predicted data, and the simulated data. In addition, a first set of delayed substrates and associated delayed data can be established when the number of substrates is greater than the number of available processing elements, and when the number of substrates is greater than the number of available evaluation elements, a second set of delayed substrates and associated delayed data can be established.

In 810, a first set of substrates can be received by one or more subsystems in a group of subsystems that can include one or more transfer subsystems. One or more of the received substrates can be selected for one or more S-O procedures, and the S-O procedure can includes a number of required evaluation sites and a number of visited evaluation sites for each substrate. Each substrate can have historical and/or real-time data associated therewith, and the historical and/or real-time data can include deposition data, partial-etch data, COR-etch data, and/or evaluation data. Alternatively, a substrate can be received by a different subsystem.

In 815, the spacer deposition procedure can be performed. A first set of substrates can be processed using one or more deposition subsystems and one or more spacer-related reference features can be created at a first number of evaluation sites on each of the first set of substrates. Real-time data and/or delayed data can be created during the spacer deposition procedure. For example, real-time "deposition" data can be created when the number of "deposition" substrates is less than or equal to the number of available processing elements 133, and delayed "deposition" data can be created, when the number of "deposition" substrates is greater than the number of available processing elements 133.

In some exemplary embodiments, a Slot Plane Antenna (SPA) microwave plasma source can be used to perform deposition procedures. The SPA microwave source can be operated at in a frequency range from approximately 2 GHz to 6 GHz, and the power can range from approximately 1000 watts to approximately 4000 watts. When $SiO_2$ films are deposited, the thicknesses can range from approximately 1 nm to approximately 25 nm, the chamber pressure can range between approximately 50 mTorr and 5 Torr, and the process gasses can include Argon (Ar) at a flow rate between 500 sccm and 2000 sccm, $O_2$ at a flow rate between 5 sccm and 500 sccm, and $H_2$ at a flow rate between 2 sccm and 50 sccm. When SiON films are deposited, the thicknesses can range from approximately 1 nm to approximately 25 nm, the Nitrogen concentration can vary between approximately 5% and approximately 40%, the chamber pressure can range between approximately 50 mTorr and 5 Torr, and the process gasses can include Argon (Ar) at a flow rate between 500 sccm and 2000 sccm, and N at a flow rate between 5 sccm and 500 sccm.

When a verified spacer deposition procedure is performed, one or more verified spacer-related features can be created at one or more sites on each of the processed substrates, and the data associated with the one or more verified spacer-related features can be stored in an S-O library. When an unverified spacer deposition procedure is performed, one or more unverified spacer-related features can be created at one or more sites on each of the processed substrates. The first set of verified spacer-related features can include a first verification feature at a first site on the first processed wafer. The verified and unverified spacer-related features can include structures used during measurement, evaluation, verification, and/or inspection procedures.

In 820, a query can be performed to determine if library data is required after a spacer layer is deposited. When library data is required, procedure 800 can branch to step 825, and when library data is not required, procedure 800 can branch to step 830. In some cases, a single spacer-deposition substrate can be selected and the selected spacer-deposition substrate can have a library creation, verification, and/or refinement sequence associated with it that can include spacer-related procedures. In other cases, additional substrates and different procedures can be used.

In 825, when library data is required for a new spacer-deposition procedure, a first library-creation sequence can be established and used. When historical library data associated with a spacer-deposition procedure requires verification or refinement, a first library-verification sequence can be established and used. One or more spacer-deposition substrates can be used to create, verify, and/or refine the library data, and a number of required sites can be established for each spacer-deposition substrate. A first site can be selected from the number of required sites on a first spacer-deposition substrate, and the first site can have a first spacer-deposition feature associated therewith that was created using the spacer deposition procedure. First spacer-deposition data can be obtained from the first site on the first substrate, and additional spacer deposition data can be obtained from additional sites on the first substrate or on additional substrates. For example, real-time spacer-deposition data can be obtained when the first spacer-deposition feature associated with the first site is measured and/or inspected. One or more of the controllers (114, 124, 134, 144, and 190) can be used to compare the real-time spacer-deposition data to data already in one or more S-O libraries.

When a matching condition is found and the confidence data associated with the matching condition is high, the first spacer-deposition feature can be identified using the library data associated with the matching condition. In addition, when a matching condition is found and the confidence data associated with the matching condition is high, the first spacer-deposition procedure can be identified as a verified spacer-deposition procedure.

When a matching condition is found and the confidence data associated with the matching condition is low, the first spacer-deposition feature can be identified using the library data associated with the matching condition and a refinement procedure can be perform to increase the confidence data. In addition, when a matching condition is found and the confidence data associated with the matching condition is low, the first spacer-deposition procedure can be identified as an un-verified spacer-deposition procedure.

When a matching condition is not found and the confidence data associated with the real-time spacer-deposition data is high, the first spacer-deposition feature can be identified as a verified structure and the data associated with the first spacer-deposition feature can be stored as verified data. In addition, when a matching condition is not found and the confidence data associated with the real-time spacer-deposition data is low, one or more corrective actions can be performed.

Alternatively, risk data, threshold data, rules data, limit data, creation data, verification data, product-related data, or process-related data may be used during matching.

In 830, one or more spacer-etch procedures can be performed. In some embodiments, a partial-etch procedure can be performed. During the partial-etch procedure, a first portion of spacer material can be removed from one or more substantially vertical surfaces, a second portion of material can be removed from one or more substantially horizontal surfaces, and a protective layer can be formed on one or more of the substantially vertical surfaces. For example, a partial-etch procedure can be performed in an SCCM Poly chamber and the processing conditions can include a chamber pressure of approximately 15-25 mTorr, a top electrode RF power level of approximately 475-525 watts, a bottom electrode RF power level of approximately 90-110 watts, a flow rate for a first process gas ($C_4F_8$) of approximately 10-30 sccm, a flow rate for a second process gas (Ar) of approximately 700-900 sccm, a backside pressure of approximately 8-12 Torr proximate the center of the substrate, a backside pressure of approximately 20-30 Torr proximate the edge of the substrate, and a substrate holder temperature of approximately 25-35 degrees C. The endpoint time for a complete etch can vary from approximately 28 seconds to 31 seconds and the partial-etch time can be between approximately 75% and 85% of the endpoint time for the complete etch. In one example, when the end point time was approximately 29.5 seconds, the partial etch time used was approximately 22.8 seconds. Alternatively, other times can be used.

In 835, a query can be performed to determine if library data is required after a spacer layer is partially-etched. When library data is required, procedure 800 can branch to step 840, and when library data is not required, procedure 800 can branch to step 845. In some cases, a single partial-etch substrate can be selected and the selected partial-etch substrate can have a library creation, verification, and/or refinement sequence associated with it that can include partial-etch-related procedures. In other cases, additional substrates and different procedures can be used.

In 840, when library data is required for a new partial-etch procedure, a second library-creation sequence can be established and used. When historical library data associated with a partial-etch procedure requires verification or refinement, a second library-verification sequence can be established and used. One or more partially-etched substrates can be used to create, verify, and/or refine the library data, and a number of required sites can be established for each partially-etched substrate. A first site can be selected from the number of required sites on a first partially-etched substrate, and the first site can have a first partially-etch feature associated therewith that was created using the partial-etch procedure. First partial-etch data can be obtained from the first site on the first substrate, and additional partial-etch data can be obtained from additional sites on the first substrate or on additional substrates. For example, real-time partial-etch data can be obtained when the first partially-etched feature associated with the first site is measured and/or inspected. One or more of the controllers (114, 124, 134, 144, and 190) can be used to compare the real-time partial-etch data to data already in one or more S-O libraries.

When a matching condition is found and the confidence data associated with the matching condition is high, the first partially-etched feature can be identified using the library data associated with the matching condition. In addition, when a matching condition is found and the confidence data associated with the matching condition is high, the first partial-etch procedure can be identified as a verified partial-etch procedure.

When a matching condition is found and the confidence data associated with the matching condition is low, the first partially-etched feature can be identified using the library data associated with the matching condition and a refinement procedure can be perform to increase the confidence data. In addition, when a matching condition is found and the confidence data associated with the matching condition is low, the first partial-etch procedure can be identified as an un-verified partial-etch procedure.

When a matching condition is not found and the confidence data associated with the real-time partial-etch data is high, the first partially-etched feature can be identified as a verified structure, and the data associated with the first partially-etched feature can be stored as verified data. In addition, when a matching condition is not found and the confidence data associated with the real-time partial-etch data is low, one or more corrective actions can be performed.

Alternatively, risk data, threshold data, rules data, limit data, creation data, verification data, product-related data, or process-related data may be used during matching.

In 845, one or more COR-etch procedures can be performed. During the COR-etch procedures, additional spacer material can be removed from the one or more substantially horizontal surfaces, and a substantially small portion of material can be removed from one or more of the protective layers formed on the one or more substantially vertical surfaces. In this process, the vertical spacer material remains substantially in tact.

When the COR procedure is performed, a chemical treatment procedure can be performed in which the surfaces on a substrate can be chemically treated using a first process gas, and a solid reaction product can be formed on at least one exposed surface of the substrate. The first process gas can include Ar, HF and $NH_3$, and the Ar flow rate can be between approximately 15 sccm and approximately 35 sccm, the HF flow rate can be between approximately 40 sccm and approximately 60 sccm, and the $NH_3$ flow rate can be between approximately 15 sccm and approximately 35 sccm. The COR chamber top wall temperature can range from approximately 30 degrees Celsius to approximately 70 degrees Celsius, the COR chamber side wall temperature can range from approximately 30 degrees Celsius to approximately 70 degrees Celsius, and a substrate holder temperature can range from approximately 40 degrees Celsius to approximately 60 degrees Celsius. The COR chamber pressure can range from approximately 5 mTorr to approximately 15 mTorr, and a COR process time can range from approximately 100 seconds to approximately 140 seconds.

In addition, a post heat treatment (PHT) procedure can be performed, the solid reaction product can be evaporated, and the chemically treated exposed surface layers can be removed. During the PHT procedure, a second process gas that includes $N_2$ can be used, and $N_2$ flow rates can vary between approximately 800 sccm and approximately 1000 sccm. The PHT chamber top wall temperature can range from approximately 70 degrees Celsius to approximately 90 degrees Celsius, the PHT chamber side wall temperature can range from approximately 70 degrees Celsius to approximately 90 degrees Celsius, and the PHT substrate holder temperature can range from approximately 120 degrees Celsius to approximately 180 degrees Celsius. In addition, the PHT chamber pressure can range from approximately 650 mTorr to approximately 700 mTorr, and a PHT process time can range from approximately 100 seconds to approximately 140 seconds.

In 850, a query can be performed to determine if library data is required after one or more COR-etch procedures are performed. When library data is required, procedure 800 can branch to step 855, and when library data is not required, procedure 800 can branch to step 860. In some cases, a single COR-etch substrate can be selected and the selected COR-etch substrate can have a library creation, verification, and/or refinement sequence associated with it that can include COR-etch-related procedures.

In 855, when library data is required for a new COR-etch procedure, a third library-creation sequence can be established and used. When historical library data associated with a COR-etch procedure requires verification or refinement, a third library-verification sequence can be established and used. One or more COR-etched substrates can be used to create, verify, and/or refine the library data, and a number of required sites can be established for each COR-etched substrate. A first site can be selected from the number of required sites on a first COR-etched substrate, and the first site can have a first partially-etch feature associated therewith that was created using the COR-etch procedure. First COR-etch data can be obtained from the first site on the first substrate, and additional COR-etch data can be obtained from additional sites on the first substrate or on additional substrates. For example, real-time COR-etch data can be obtained when the first COR-etch feature associated with the first site is measured and/or inspected. One or more of the controllers (114, 124, 134, 144, and 190) can be used to compare the real-time COR-etch data to data already in one or more S-O libraries.

When a matching condition is found and the confidence data associated with the matching condition is high, the first COR-etch feature can be identified using the library data associated with the matching condition. In addition, when a matching condition is found and the confidence data associated with the matching condition is high, the first COR-etch procedure can be identified as a verified COR-etch procedure.

When a matching condition is found and the confidence data associated with the matching condition is low, the first COR-etch feature can be identified using the library data associated with the matching condition and a refinement procedure can be perform to increase the confidence data. In addition, when a matching condition is found and the confidence data associated with the matching condition is low, the first COR-etch procedure can be identified as an un-verified COR-etch procedure.

When a matching condition is not found and the confidence data associated with the real-time COR-etch data is high, the first COR-etch feature can be identified as a verified structure and the data associated with the first COR-etch feature can be stored as verified data. In addition, when a matching condition is not found and the confidence data associated with the real-time COR-etch data is low, one or more corrective actions can be performed.

Alternatively, risk data, threshold data, rules data, limit data, creation data, verification data, product-related data, or process-related data may be used during matching.

In 860, a query can be performed to determine if additional procedures are required. When additional procedures are required, procedure 800 can branch to step 865, and when additional procedures are not required, procedure 800 can branch to step 870.

In 875, a query can be performed to determine if an additional substrate is required. When an additional substrate is required, procedure 800 can branch to step 810, and when an additional substrate is not required, procedure 800 can branch to step 880. In 880, procedure 800 can end.

In some examples, when library data is being created and/or refined, additional sites can be used on the first S-O substrate. When library data cannot be obtained using the data from a first site, data from one or more additional sites on the first S-O substrate can be used. When library data cannot be obtained using the data from a first substrate, data from one or more additional sites on one or more additional S-O substrates can be used. For example, when matching, confidence, and/or risk decisions cannot be made using the data from a first site, data from one or more additional sites and/or S-O substrates can be used.

When an additional substrate is required, an additional site can be selected from the number of required sites on an additional evaluation substrate, and the additional site can have an additional evaluation feature associated therewith that was created using a verified S-O procedure. Additional S-O library data can be obtained from the additional site when an additional library creation limit is met, the additional site can be identified as an additional verified site. Additional sites can be used when the number of required sites is greater than zero, and the library creation process can be stopped when the number of required sites is equal to zero.

When a new site is required, a new site can be selected from the number of evaluation sites on the S-O substrate, and the new site can have a new evaluation feature associated therewith that was created using the first S-O procedure. The new site can have a verified feature associated therewith when it was produced using a verified S-O procedure, and the new site can have an un-verified feature associated therewith when it was produced using an un-verified S-O procedure. New S-O evaluation data can be obtained from the new evaluation site. For example, new S-O evaluation data can be obtained from one or more of the subsystems (110, 120, 130, 140, and 170). In addition, new S-O verification data can be established for the new site on the first S-O substrate, and the new S-O verification data that can be obtained from an S-O evaluation library and/or database. New confidence data and/or risk data can be established for the new site using a new difference between the new S-O evaluation data and the new S-O verification data. The S-O procedure can be identified as a verified S-O procedure when a new verification limit is met, and the S-O procedure can be identified as an un-verified S-O procedure when the new verification limit is not met.

One or more of the transfer subsystems (150, 160) can be configured for transferring one or more S-O substrates to one of the subsystems (110, 120, 130, 140, and 170) before, during, and/or after an S-O procedure is performed. In addition, the one or more of the transfer subsystems (150, 160) can be configured for delaying the additional S-O substrate for a first amount of time using a transfer element (154, 164) in the transfer subsystems (150, 160), and the transfer element (154 and 164) can support two or more substrates. After a second amount of time, the additional S-O substrate can be processed in one or more of the subsystems (110, 120, 130, 140, and 170). When delayed substrates are used, one or more of the controllers (114, 124, 134, 144, and 190) can also be configured to establish delayed confidence and/or risk data and to use the delayed data to make additional process corrections and/or improvements.

S-O data can include the library data associated with one or more deposition procedures, the library data associated with one or more partial-etch procedures, and the library data associated with one or more COR-etch procedures.

In general, the library data may include modeling data, simulation data, predicted data, measurement data, inspection data, evaluation data, confidence, risk data, etc. The library data may also be characterized by a set of wavelengths established for each S-O procedure.

The library data associated with spacer-deposition procedures, partial-etch procedures, and COR-etch procedures can include profile data and optical data associated with partially-etched spacer layers on a variety of structures including: single layer spacers, multi-layer spacers, partially-etched structures, protected structures, etched structures, trimmed structures, doped structures, filled structures, semi-filled structures, damaged structures, capacitor structures, gate structures, gate electrode structures, gate stack structures, transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or any combination thereof.

In additional embodiments, when one or more partial-etch procedures are performed, one or more of the spacer layers on one or more S-O substrates can be partially etched, and one or more partially-etched evaluation structures can be created at a first number of evaluation sites on the one or more partially-etched substrates. First optical data from can be obtained from a first evaluation site on a first partial-etch evaluation substrate selected from the one or more partially-etched substrates, and first library data can be obtained from an S-O evaluation library. A first partial-etch risk factor can be established for the first partial-etch evaluation substrate using first differences between the first optical data and the first library data. When the first partial-etch risk factor is less than or equal to a first partial-etch risk limit (minimal risk involved), the first optical data can be identified as historical data that is already in the library; when the first partial-etch risk data is greater than the first partial-etch risk limit and the first partial-etch risk data is less than or equal to a second partial-etch risk limit (some risk allowed), the first optical data can be stored as verified data in the S-O evaluation library with the confidence and/or risk data associated therewith; and when the first partial-etch risk factor is greater than the second partial-etch risk limit, a first corrective action can be performed, and the first optical data can be identified as unverified data. For example, corrective actions can be performed to mitigate the risk.

Modeling procedures can create, refine, update, correct, verify, and/or use a partial-etch model, a COR model, a substrate model, an accuracy model, a recipe model, an optical properties model, a structure model, a FDC model, a prediction model, a confidence model, a measurement model, an etching model, a deposition model, a first substrate effect model, a chamber model, a chamber match model, a drift model, a delay time model, an electrical performance model, or a device model, or any combination thereof. In addition, prediction models can include process chemistry models, chamber models, EM models, SPC charts, PLS models, PCA models, FDC models, and Multivariate Analysis (MVA) models.

An S-O procedure can be specified by a semiconductor manufacturer based on data stored in a historical database. For example, a semiconductor manufacturer may have historically chosen a number of sites on the substrate when making SEM measurements and would like to verify the evaluation data using the data measured using a SEM system, TEM system and/or FIB system. In addition, the number of evaluation sites used can be reduced as the manufacturer becomes more confident that the process is and will continue to produce high quality products and/or devices.

S-O procedures can be used by a subsystem to adjust recipes and/or models in real-time to produce three-dimensional structures, such as single gate and multi-gate transistors In addition, S-O procedures can be used by subsystems to adjust evaluation, inspection, verification, and/or measurement recipes and/or models in real-time to evaluate, inspect, verify, and/or measure three-dimensional pFET and nFET gate structures. The three-dimensional structures can increase the sensitivity of spacer thickness variations and require structure modeling and/or measurements in multiple directions. Evaluation subsystems can cause throughput problems and higher measurement throughput can be obtained by adjusting the sampling locations, and structures dynamically in procedures. For example, as dimensions get smaller substrate profile data can have a greater impact during aligning, measuring, and/or processing. The substrate profile data can include radius data, curvature data, feature data, and/or thickness data.

When iODP measurements are made, bottom CD data, top CD data, and SWA data can be obtained. In some examples, oxide thickness can be measured between line in a grating, and the grating range can be 250-315 nm. In other examples, oxide thickness can be measured using a pad feature that is adjacent a structure, and the pad feature can be approximately 50×50 micrometers.

In some embodiments, gate processing data can be fed forward to S-O procedures, and the gate processing data can be used to identify a data space in an S-O library. For example, the spacer thickness data for an iODP model can be obtained by measuring the thickness of the spacer material between gate structures and/or spacer structures. In some examples, separate feedback control loops can be configured.

In some examples, pre-processing data can be established for an S-O procedure using one or more gate structures, and the one or more gate structures can be measured using a pre-processing IM procedure. In other examples, pre-processing data can be established for an S-O procedure using one or more deposited layers, and the one or more deposited layers can be measured before a "partial-etch" procedure is performed using the first IM procedure. The data from the first IM procedure can be used to optimize the partial-etch process, the COR-etch process, second IM procedure, or the third IM procedure, or any combination thereof, and the data can include CD data, SWA data, or thickness data, or any combination thereof. The data from the second IM procedure can be used to optimize the partial-etch process, the COR-etch process, first IM procedure, or the third IM procedure, or any combination thereof. The data from the third IM procedure can be used to optimize the gate-etch process, the COR-etch process, the first IM procedure, or the second IM procedure, or any combination thereof, and the data can include CD data, SWA data, or thickness data, or any combination thereof.

In some examples, the spacer thickness can be controlled by the partial-etch recipe and the thickness of the protection layer created during the partial-etch procedure. IM procedures can be used to measure and feedback the thickness data for the "protected" spacer layer and/or the protection layer. In addition, IM procedures can be used to monitor the uniformity of the substrate. IM procedures can use one or more pads and one or more gratings. For example, the data from the grating can be used to measure the gate CD, sidewall angle, and the spacer CD, while the pad can be used to provide the thickness data for the "protected" spacer layer and/or the protection layer. The calculation of the thickness of the "protected" spacer layer and/or the protection layer can be achieved by using an integrated Scatterometry (SE or RP), or using and X-Ray Fluorescence (XRF) (both referred to as IM).

Un-controlled spacer thicknesses can affect the channel area, the electronic properties, and the switching speed. In various embodiments, spacer thickness can be controlled to optimize the electrical gate length by affecting the masking of implant steps. Spacer parameters can also be optimized to control the overlap capacitance, and/or breakdown voltages between the gate and source/drain contacts. In addition, S-O procedures can be used to affect the geometric physical interfaces between films, thereby changing the electric fields or fringing fields.

In some embodiments, one or more etch steps can be used to control the spacer thickness. For example, a controllable partial-etch procedure and one or more measurement procedures can be used to control the spacer thickness. In one measurement method, the spacer thickness can be accurately measured by making a pre-measurement of a pad area, calculating the combined spacer thickness, and then calculating the difference. By controlling a difference instead of an absolute thickness, this method compensates for variation in the buried oxide that is not controlled as accurately as the gate oxide. In some examples, the spacer material can be removed using a COR process, the substrate can be transferred under vacuum to another IM element, and the same measurement features can be used to verify the COR procedure. Measuring the gate grating can provide spacer sidewall thickness data. By integrating the COR and IM steps, the opportunity for native oxide growth is eliminated.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A method of creating a Spacer-Optimization (S-O) evaluation library comprising:

receiving a plurality of S-O substrates by a first transfer subsystem in a processing system, the first transfer subsystem being coupled to a first group of subsystems, each S-O substrate having substrate data associated therewith, wherein the substrate data includes historical and/or real-time data, wherein the S-O substrates comprise a plurality of S-O structures, each S-O substrate having one or more spacer layers, the plurality of S-O structures including a plurality of gate structures and one or more evaluation structures;

establishing a library-creation sequence for each S-O substrate, the library-creation sequence being used to create a library of S-O evaluation data, the library-creation sequence being created using the substrate data, wherein the library-creation sequence comprises a partial-etch procedure, a Chemical Oxide Removal (COR)-etch procedure, or a S-O evaluation procedure, or any combination thereof;

performing a first partial-etch procedure using one or more of the S-O substrates, wherein the one or more spacer layers on the S-O substrates are partially etched, and one or more partially-etched evaluation structures are created at a first number of partial-etch sites on one or more partially-etched substrates;

obtaining first optical data from a first partial-etch site on a first partial-etch evaluation substrate selected from the one or more partially-etched substrates;

obtaining first library data from an S-O evaluation library;

establishing a first partial-etch risk factor for the first partial-etch evaluation substrate using first differences between the first optical data and the first library data;

identifying the first optical data as historical data in the library when the first partial-etch risk factor is less than or equal to a first partial-etch risk limit, wherein a first amount of partial-etch risk is allowed;

storing the first optical data as verified data in the S-O evaluation library when the first partial-etch risk factor is greater than the first partial-etch risk limit and the first partial-etch risk factor is less than or equal to a second partial-etch risk limit, wherein a second amount of partial-etch risk is allowed; and performing a first corrective action and identifying the first optical data as unverified data when the first partial-etch risk factor is greater than the second partial-etch risk limit, wherein one or more corrective actions can be performed during risk mitigation.

2. The method of claim 1, further comprising:

establishing first predicted partial-etch data for the first partial-etch site on the first partial-etch evaluation substrate, wherein the first predicted partial-etch data comprises predicted partial-etch measurement data;

establishing a first partial-etch confidence value for the first partial-etch evaluation substrate using differences between the first optical data and the first predicted partial-etch data;

identifying the first optical data as high confidence partial-etch data when the first partial-etch confidence value is greater than or equal to a first partial-etch confidence limit; and identifying the first optical data as low confidence partial-etch data when the first partial-etch confidence value is less than the first partial-etch confidence limit.

3. The method of claim 1, wherein performing the first corrective action further comprises:
 a) selecting a new partial-etch site from a number of required partial-etch sites on the first partial-etch evaluation substrate, wherein the new partial-etch site has a new partial-etch feature associated therewith that was created using the first partial-etch procedure;
 b) obtaining new optical data from the new partial-etch site on the first partial-etch evaluation substrate;
 c) obtaining new library data from the S-O evaluation library;
 d) establishing a new first partial-etch risk factor for the first partial-etch evaluation substrate using new differences between the new optical data and the new library data;
 e) identifying the new optical data as historical data in the library, decreasing the number of required partial-etch sites by one, when the new first partial-etch risk factor is less than or equal to a new first partial-etch risk limit, wherein a new first amount of partial-etch risk is allowed;
 f) storing the new optical data as new verified data in the S-O evaluation library, decreasing the number of required partial-etch sites by one, when the new first partial-etch risk factor is greater than the new first partial-etch risk limit and the new first partial-etch risk factor is less than or equal to a new second partial-etch risk limit;
 g) performing a new corrective action, decreasing the number of required partial-etch sites by one, and identifying the new optical data as new unverified data when the new first partial-etch risk factor is greater than the new second partial-etch risk limit;
 h) repeating steps a)-g) when the number of required partial-etch sites is greater than zero; and
 i) stopping an S-O evaluation library creation process when the number of required partial-etch sites is equal to zero.

4. The method of claim 1, wherein performing the first corrective action further comprises:
 a1) selecting an additional partial-etch site from a number of required partial-etch sites on an additional partial-etch evaluation substrate, wherein the additional partial-etch site has an additional partial-etch feature associated therewith that was created using the first partial-etch procedure;
 b1) obtaining additional optical data from the additional partial-etch site on the additional partial-etch evaluation substrate;
 c1) obtaining additional library data from the S-O evaluation library;
 d1) establishing an additional first partial-etch risk factor for the additional partial-etch evaluation substrate using additional differences between the additional optical data and the additional library data;
 e1) identifying the additional optical data as historical data in the library, decreasing the number of required partial-etch sites by one, when the additional first partial-etch risk factor is less than or equal to an additional first partial-etch risk limit, wherein an additional amount of first partial-etch risk is allowed;
 f1) storing the additional optical data as additional verified data in the S-O evaluation library, decreasing the number of required partial-etch sites by one, when the additional first partial-etch risk factor is greater than the additional first partial-etch risk limit and the additional first partial-etch risk factor is less than or equal to an additional second partial-etch risk limit; and
 g1) performing an additional corrective action, decreasing the number of required partial-etch sites by one, and identifying the additional optical data as additional unverified data when the additional first partial-etch risk factor is greater than the additional second partial-etch risk limit;
 h1) repeating steps a1)-g1) when the number of required partial-etch sites is greater than zero; and
 i1) stopping the S-O library creation process when the number of required partial-etch sites is equal to zero.

5. The method of claim 1, further comprising:
 performing a first COR-etch procedure using one or more of the partially-etched substrates, wherein one or more partially-etched spacer layers on the partially-etched substrates are COR etched, and one or more COR-etched evaluation structures are created at a first number of COR-etch sites on one or more COR-etched substrates;
 obtaining second optical data from a first COR-etch site on a first COR-etch evaluation substrate selected from the one or more COR-etched substrates;
 obtaining second library data from the S-O evaluation library;
 establishing a first COR-etch risk factor for the first COR-etch evaluation substrate using second differences between the second optical data and the second library data;
 identifying the second optical data as historical data in the library when the first COR-etch risk factor is less than or equal to a first COR-etch risk limit, wherein a first amount of COR-etch risk is allowed;
 storing the second optical data as verified data in the S-O evaluation library when the first COR-etch risk factor is greater than the first COR-etch risk limit and the first COR-etch risk factor is less than or equal to a second COR-etch risk limit, wherein a second amount of COR-etch risk is allowed; and
 performing a second corrective action and identifying the second optical data as unverified data when the first COR-etch risk factor is greater than the second COR-etch risk limit.

6. The method of claim 5, further comprising:
 establishing first predicted COR-etch data for the first COR-etch site on the first COR-etch evaluation substrate, wherein the first predicted COR-etch data comprises predicted COR-etch measurement data;
 establishing a first COR-etch confidence value for the first COR-etch evaluation substrate using differences between the first optical data and the first predicted COR-etch data;
 identifying the first optical data as high confidence COR-etch data when the first COR-etch confidence value is greater than or equal to a first COR-etch confidence limit; and
 identifying the first optical data as low confidence COR-etch data when the first COR-etch confidence value is less than the first COR-etch confidence limit.

7. The method of claim 5, wherein performing the second corrective action further comprises:
 a2) selecting a new COR-etch site from a number of required COR-etch sites on the first COR-etch evaluation substrate, wherein the new COR-etch site has a new COR-etch feature associated therewith that was created using the first COR-etch procedure;
 b2) obtaining new optical data from the new COR-etch site on the first COR-etch evaluation substrate;

c2) obtaining new library data from the S-O evaluation library;

d2) establishing a new first COR-etch risk factor for the first COR-etch evaluation substrate using new differences between the new optical data and the new library data;

e2) identifying the new optical data as historical data in the library, decreasing the number of required COR-etch sites by one, when the new first COR-etch risk factor is less than or equal to a new first COR-etch risk limit, wherein a new first amount of COR-etch risk is allowed;

f2) storing the new optical data as new verified data in the S-O evaluation library, decreasing the number of required COR-etch sites by one, when the new first COR-etch risk factor is greater than the new first COR-etch risk limit and the new first COR-etch risk factor is less than or equal to a new second COR-etch risk limit;

g2) performing a new corrective action, decreasing the number of required COR-etch sites by one, and identifying the new optical data as new unverified data when the new first COR-etch risk factor is greater than the new second COR-etch risk limit;

h2) repeating steps a2)-g2) when the number of required COR-etch sites is greater than zero; and i2) stopping the S-O evaluation library creation process when the number of required COR-etch sites is equal to zero.

8. The method of claim 5, wherein performing the second corrective action further comprises:

a3) selecting an additional COR-etch site from a number of required COR-etch sites on an additional COR-etch evaluation substrate, wherein the additional COR-etch site has an additional COR-etch feature associated therewith that was created using the first COR-etch procedure;

b3) obtaining additional optical data from the additional COR-etch site on the additional COR-etch evaluation substrate;

c3) obtaining additional library data from the S-O evaluation library;

d3) establishing an additional first COR-etch risk factor for the additional COR-etch evaluation substrate using additional differences between the additional optical data and the additional library data;

e3) identifying the additional optical data as historical data in the library, decreasing the number of required COR-etch sites by one, when the additional first COR-etch risk factor is less than or equal to an additional first COR-etch risk limit, wherein an additional first amount of COR-etch risk is allowed;

f3) storing the additional optical data as additional verified data in the S-O evaluation library, decreasing the number of required COR-etch sites by one, when the additional first COR-etch risk factor is greater than the additional first COR-etch risk limit and the additional first COR-etch risk factor is less than or equal to an additional second COR-etch risk limit;

g3) performing an additional corrective action, decreasing the number of required COR-etch sites by one, and identifying the additional optical data as additional unverified data when the additional first COR-etch risk factor is greater than the additional second COR-etch risk limit;

h3) repeating steps a3)-g3) when the number of required COR-etch sites is greater than zero; and i3) stopping an S-O evaluation library creation process when the number of required COR-etch sites is equal to zero.

9. The method of claim 1, wherein one or more deposition procedures are performed before the first partial-etch procedure is performed.

10. The method of claim 1, wherein the plurality of S-O structures comprise a bulk silicon layer, a buried oxide layer, a silicon-on-insulator (SOI) layer, a gate oxide layer, an undoped poly-Si layer, a doped poly-SI layer, a nitride cap layer, an oxide layer, or a bottom antireflective coating (BARC) layer, or any combination thereof.

11. The method of claim 1, wherein the plurality of S-O structures comprises spaces in a periodic structure, lines in a periodic structure, or test pads in a scribe line, or any combination thereof.

12. The method of claim 1, further comprising:

calculating a first confidence map for a first S-O substrate, the first confidence map including confidence data for a first set of confidence sites on the first S-O substrate; and establishing the library-creation sequence using a first updated S-O sequence, wherein the first updated S-O sequence comprises one or more additional confidence sites when one or more values in the first confidence map are not within a first confidence limit, wherein a number of confidence sites is increased by establishing one or more new confidence sites for the first S-O substrate, and wherein the first updated S-O sequence comprises one or more fewer confidence sites when the one or more values in the first confidence map are within the first confidence limit, wherein the number of confidence sites is decreased by establishing one or more less confidence sites for the first S-O substrate.

13. The method of claim 1, wherein the S-O evaluation library comprises at least one of Goodness of Fit (GOF) data, creation rules data, measurement data, inspection data, verification data, mapping data, confidence data, risk data, intensity data, transmission data, absorption data, reflectance data, diffraction data, accuracy data, process data, or uniformity data, or any combination thereof.

14. The method of claim 1, wherein the S-O evaluation library is verified using CD-scanning electron microscope (CD-SEM) data, transmission electron microscope (TEM) data, and/or focused ion beam (FIB) data.

15. The method of claim 1, wherein the library-creation sequence comprises at least one of one or more lithography-related procedures, one or more scanner-related procedures, one or more inspection-related procedures, one or more measurement-related procedures, one or more evaluation-related procedures, one or more etch-related procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

16. A computer-readable storage medium containing computer-executable instructions for creating an Spacer-Optimization (S-O) evaluation library, the method comprising instructions for:

receiving a plurality of S-O substrates by a first transfer subsystem in a processing system, the first transfer subsystem being coupled to a first group of subsystems, each S-O substrate having substrate data associated therewith, wherein the substrate data includes historical and/or real-time data;

establishing a library-creation sequence for each S-O substrate, the library-creation sequence being used to create a library of S-O evaluation data, the library-creation sequence being created using the substrate data, wherein the library-creation sequence comprises a partial-etch procedure, a Chemical Oxide Removal (COR)-etch procedure, or a S-O evaluation procedure, or any combination thereof;

performing a first partial-etch procedure using one or more of the S-O substrates, wherein one or more partial-etched substrates are created by the first partial-etch procedure and one or more partial-etch features are created at a first number of partial-etch sites on each of the partial-etched substrates;

performing a first partial-etch evaluation procedure using a first partial-etch evaluation substrate, wherein first partial-etch risk data is established for the first partial-etch evaluation substrate by using partial-etch data from a S-O evaluation library;

identifying the first partial-etch evaluation substrate as a verified partial-etch substrate when the first partial-etch risk data is less than or equal to a first partial-etch risk limit; and obtaining additional partial-etch data and identifying the first partial-etch evaluation substrate as an unverified partial-etch substrate when the first partial-etch risk data is greater than the first partial-etch risk limit.

* * * * *